(12) United States Patent
Shishido

(10) Patent No.: US 9,484,365 B2
(45) Date of Patent: Nov. 1, 2016

(54) SEMICONDUCTOR DEVICE INCLUDING SWITCH ELECTRICALLY CONNECTED TO SIGNAL LINE

(71) Applicant: SEMICONDUCTOR ENERGY LABORATORY CO., LTD., Atsugi-shi, Kanagawa-ken (JP)

(72) Inventor: Hideaki Shishido, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/448,180

(22) Filed: Jul. 31, 2014

(65) Prior Publication Data
US 2014/0339553 A1    Nov. 20, 2014

Related U.S. Application Data

(62) Division of application No. 13/005,232, filed on Jan. 12, 2011, now Pat. No. 8,796,785.

(30) Foreign Application Priority Data

Jan. 15, 2010    (JP) .................................. 2010-006419

(51) Int. Cl.
*H01L 29/76* (2006.01)
*H01L 29/94* (2006.01)
(Continued)

(52) U.S. Cl.
CPC ........... *H01L 27/124* (2013.01); *G09G 3/3688* (2013.01); *H01L 27/1225* (2013.01);
(Continued)

(58) Field of Classification Search
CPC ............... H01L 27/112; H01L 27/115; H01L 25/0753; H01L 33/62; H01L 27/0207; H01L 23/528; H01L 23/5258; H01L 23/5256; H01L 27/1214; H01L 27/12; H01L 27/124; H01L 27/1225; H01L 25/075; H01L 27/15; H01L 33/08; H01L 23/525; H01L 27/11206; H01L 27/105
USPC .................. 257/390, 88, 208, 209, 211, 72; 327/427; 345/80, 92, 99; 349/42
See application file for complete search history.

(56) References Cited

U.S. PATENT DOCUMENTS 5,555,001 A    9/1996  Lee et al.
5,616,936 A    4/1997  Misawa et al.
(Continued)

FOREIGN PATENT DOCUMENTS

CN    101609654 A    12/2009
CN    101796565 A    8/2010
(Continued)

OTHER PUBLICATIONS

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
(Continued)

*Primary Examiner* — Yu Chen
*Assistant Examiner* — Dilinh Nguyen
(74) *Attorney, Agent, or Firm* — Nixon Peabody LLP; Jeffrey L. Costellia

(57) ABSTRACT

To suppress variation of a signal in a semiconductor device. By suppressing the variation, formation of a stripe pattern in displaying an image on a semiconductor device can be suppressed, for example. A distance between two adjacent signal lines which go into a floating state in different periods (G1) is longer than a distance between two adjacent signal lines which go into a floating state in the same period (G0, G2). Consequently, variation in potential of a signal line due to capacitive coupling can be suppressed. For example, in the case where the signal line is a source signal line in an active matrix display device, formation of a stripe pattern in a displayed image can be suppressed.

14 Claims, 14 Drawing Sheets

(51) Int. Cl.
  *H01L 31/062* (2012.01)
  *H01L 31/113* (2006.01)
  *H01L 31/119* (2006.01)
  *H01L 33/00* (2010.01)
  *H01L 27/10* (2006.01)
  *H01L 27/12* (2006.01)
  *G09G 3/36* (2006.01)
  *G02F 1/1333* (2006.01)
  *G02F 1/1345* (2006.01)
  *G02F 1/1362* (2006.01)
  *G02F 1/1368* (2006.01)

(52) U.S. Cl.
  CPC ..... *G02F1/13454* (2013.01); *G02F 1/133305* (2013.01); *G02F 1/136286* (2013.01); *G02F 2001/13685* (2013.01); *G02F 2001/136295* (2013.01); *G09G 2300/0408* (2013.01); *G09G 2300/0426* (2013.01); *G09G 2320/0209* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,781,171 A | 7/1998 | Kihara et al. |
| 5,956,009 A | 9/1999 | Zhang et al. |
| 6,175,348 B1 | 1/2001 | Zhang et al. |
| 6,294,274 B1 | 9/2001 | Kawazoe et al. |
| 6,429,843 B1 | 8/2002 | Zhang et al. |
| 6,563,174 B2 | 5/2003 | Kawasaki et al. |
| 6,727,522 B1 | 4/2004 | Kawasaki et al. |
| 6,982,692 B2 | 1/2006 | Kim |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,310,402 B2 | 12/2007 | Wei et al. |
| 7,323,356 B2 | 1/2008 | Hosono et al. |
| 7,385,224 B2 | 6/2008 | Ishii et al. |
| 7,394,447 B2 * | 7/2008 | Mochizuki et al. ........ 345/100 |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,502,007 B2 | 3/2009 | Ishii |
| 7,674,650 B2 | 3/2010 | Akimoto et al. |
| 7,732,819 B2 | 6/2010 | Akimoto et al. |
| 8,599,188 B2 | 12/2013 | Zhan et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0006997 A1 | 1/2003 | Ogawa et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0219178 A1 | 10/2005 | Nah et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0109222 A1 | 5/2006 | Lee et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158132 A1 * | 7/2008 | Chiang et al. ............ 345/100 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277707 A1 | 11/2008 | Kimura |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0146219 A1 | 6/2009 | Liu |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0303404 A1 | 12/2009 | Kretz |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0295042 A1 | 11/2010 | Yano et al. |
| 2011/0261095 A1 | 10/2011 | Missbach |

FOREIGN PATENT DOCUMENTS

| | | |
|---|---|---|
| EP | 1517291 A | 3/2005 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-308535 A | 11/1994 |
| JP | 07-175038 A | 7/1995 |

(56) References Cited

FOREIGN PATENT DOCUMENTS

| JP | 08-264794 A | 10/1996 |
|---|---|---|
| JP | 09-325347 A | 12/1997 |
| JP | 11-505377 | 5/1999 |
| JP | 2000-044236 A | 2/2000 |
| JP | 2000-148067 A | 5/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077483 A | 3/2005 |
| TW | 200518023 | 6/2005 |
| TW | 200717437 | 5/2007 |
| TW | 200941729 | 10/2009 |
| WO | WO-2004/114391 | 12/2004 |

OTHER PUBLICATIONS

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Invitation to pay additional fees (application No. PCT/JP2010/073476), International Searching Authority, dated Jan. 25, 2011.

Coates.D et al., "Optical Studies of the Amorphous Liquid-Cholesteric Liquid Crystal Transition the "Blue Phase"", Physical Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper-Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 ' SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-623.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display with Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Nowatari.H et al., "60.2: Intermediate Connector with Supressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2: Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs with a Novel Passivation Layer", SID Digest '09 : SID International Symposium Digest of Technical Papers, May 31, 2009, pp. 284-287.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review, B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '05 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B(Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Ohm.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21. No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Chinese Office Action (Application No. 201080061403.7) Dated Feb. 27, 2015.

Taiwanese Office Action (Application No. 100100330) Dated May 21, 2015.

Taiwanese Office Action (Application No. 104130437) Dated Jul. 19, 2016.

* cited by examiner

SEMICONDUCTOR DEVICE INCLUDING SWITCH ELECTRICALLY CONNECTED TO SIGNAL LINE

TECHNICAL FIELD

The present invention relates to a semiconductor device. In particular, the present invention relates to a semiconductor device which displays an image by active matrix driving. Further, the present invention relates to an electronic device including the semiconductor device.

Note that the semiconductor device in this specification indicates all the devices that operate by utilizing semiconductor characteristics.

BACKGROUND ART

A semiconductor device which displays an image by active matrix driving (hereinafter such a device is also referred to as an active matrix display device) has been widely used. The semiconductor device includes a pixel portion in which an image is displayed and a driver circuit which controls displaying of an image in the pixel portion. Specifically, in the semiconductor device, an image signal input to a plurality of pixels arranged in matrix in the pixel portion is controlled by the driver circuit and an image is thus displayed. Note that the driver circuit and the plurality of pixels provided in the pixel portion each have a transistor.

It is desirable from the standpoint of reducing manufacturing cost and reducing the size and the weight of such a semiconductor device that a transistor included in each pixel and a transistor included in a driver circuit or part of the driver circuit be formed over the same substrate. Note that the characteristics required for these transistors are different from each other. For example, the transistor included in each pixel is required to be formed over a glass substrate (formed by a low-temperature process) and the transistor included in the driver circuit is required to be driven at high frequencies. Therefore, a transistor which can be formed by a low-temperature process such as plasma CVD is preferable as the transistor included in each pixel, and a transistor with high field-effect mobility is preferable as the transistor included in the driver circuit.

Typically, a transistor including amorphous silicon is preferable as the transistor included in each pixel, and a transistor including single crystal silicon or polycrystalline silicon is preferable as the transistor included in the driver circuit. However, it is difficult for the transistor including amorphous silicon to be driven at high frequencies, and it is difficult for the transistor including single crystal silicon or polycrystalline silicon to be formed by a low-temperature process.

In view of the foregoing problems, a technique called polyphase driving (hereinafter also referred to as data division driving) has been developed. Data division driving is a technique in which an image signal input from the outside is divided into a plurality of image signals, and the plurality of image signals are concurrently input to a plurality of pixels. Thus, the operating frequency of the driver circuit can be reduced. For example, when an image signal is divided into four, the operating frequency of a driver circuit can be reduced to a quarter of the operating frequency prior to the signal division.

However, in the case of performing data division driving, a driver circuit has a complex structure; for example, the number of wirings which supply image signals to a pixel portion (hereinafter, such wirings are also referred to as data signal lines) is increased. Thus, wirings which supply image signals to pixels (hereinafter, such wirings are also referred to as source signal lines) might vary in wiring resistance and parasitic capacitance. In that case, image signals input to pixels vary due to the difference among the source signal lines in wiring resistance and parasitic capacitance, whereby a stripe pattern might be formed in a displayed image.

In Patent Document 1, a technique of suppressing formation of a stripe pattern is disclosed. Specifically, a technique of suppressing formation of a stripe pattern in a displayed image by leveling wiring resistances and parasitic capacitances in a plurality of source signal lines is disclosed in Patent Document 1.

REFERENCE

[Patent Document 1] Japanese Published Patent Application No. H9-325347

DISCLOSURE OF INVENTION

As described above, in an active matrix display device, an image signal input from the outside is input to a pixel portion through a data signal line. In general, a switch is provided between one data signal line and each of a plurality of source signal lines, and electrical connection between the data signal line and the source signal lines are controlled by the switches. In other words, the plurality of switches are successively turned on so that the plurality of source signal lines are electrically connected to the data signal line one by one. Accordingly, a desired image signal is supplied from the data signal line to each source signal line.

Also in a display device which performs data division driving, an image signal is supplied from a data signal line to each source signal line in a similar way. Specifically, in the case where an image signal is divided into four, four data signal lines are provided and a switch is provided between each of the data signal lines and each of a plurality of source signal lines. The switches are divided into groups each including four switches. That is to say, the groups each including four switches are successively turned on in order that four source signal lines in each group may be electrically connected to the four data signal lines. Consequently, the operating frequency of the switch is reduced to a quarter of the operating frequency prior to the signal division, and a desired image signal is supplied from a data signal line to each source signal line.

However, in a display device which performs data division driving, a displayed image might have a stripe pattern at the boundary of the groups. More specifically, in the case where the switches are divided into groups of four, a displayed image might have a stripe pattern at the boundary between a source signal line in a 4k-th position (k is a natural number) and a source signal line in a (4k+1)-th position.

In view of the foregoing problems, an object of an embodiment of the present invention is to suppress variation of a signal in a semiconductor device. Note that by suppressing the variation, formation of a stripe pattern in displaying an image on a semiconductor device can be suppressed, for example.

One of the above problems can be solved by suppressing change of a signal in a semiconductor device which is due to capacitive coupling.

That is to say, an embodiment of the present invention is a semiconductor device including first to n-th switches (n is a natural number of 2 or more) which are turned on in a first period and turned off in a second period; (n+1)-th to m-th switches (m is a natural number of n+2 or more) which are turned off in the first period and in an on state in the second period; first to n-th signal lines; and (n+1)-th to m-th signal lines. A signal is supplied to the first signal line in the first period through the first switch, and the first signal line is in a floating state in the second period. A signal is supplied to the n-th signal line in the first period through the n-th switch, and the n-th signal line is in a floating state in the second period. The (n+1)-th signal line is in a floating state in the first period, and a signal is supplied to the (n+1)-th signal line in the second period through the (n+1)-th switch. The m-th signal line is in a floating state in the first period, and a signal is supplied to the m-th signal line in the second period through the m-th switch. The first to m-th signal lines are parallel or approximately parallel. A distance between the n-th signal line and the (n+1)-th signal line is longer than a distance between the (n−1)-th signal line and the n-th signal line and longer than a distance between the (n+1)-th signal line and the (n+2)-th signal line.

In a semiconductor device which is an embodiment of the present invention, a distance between two adjacent signal lines which go into a floating state in different periods is longer than a distance between two adjacent signal lines which go into a floating state in the same period. Consequently, variation in potential of a signal line due to capacitive coupling can be suppressed. For example, in the case where the signal line is a source signal line in an active matrix display device, formation of a stripe pattern in a displayed image can be suppressed.

BEST MODE FOR CARRYING OUT THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

Note that the size, the thickness of a layer, or a region of each structure illustrated in drawings or the like in embodiments is exaggerated for simplicity in some cases. Therefore, embodiments of the present invention are not limited to such scales. Further, in this specification, ordinal numbers such as "first", "second", and "third" are used in order to avoid confusion among components, and the terms do not limit the components numerically.

Embodiment 1

In this embodiment, a semiconductor device which is an embodiment of the present invention is described with reference to FIGS. 1A to 1C, FIGS. 2A and 2B, FIGS. 3A and 3B, FIGS. 4A to 4C, FIGS. 5A and 5B, FIGS. 6A and 6B, and FIG. 7.

Figure 1A:
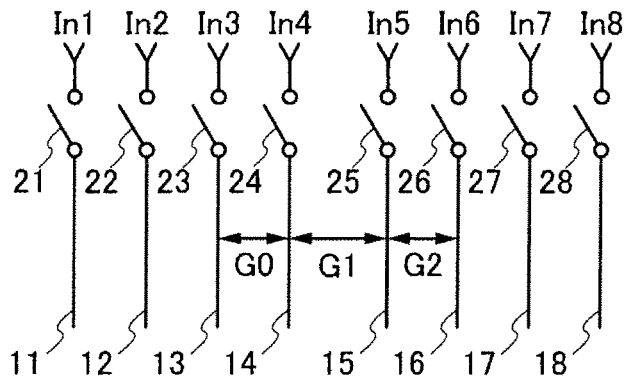
FIGS. 1A to 1C illustrate a semiconductor device in Embodiment 1.

FIG. 1A illustrates positions of a plurality of signal lines 11 to 18 and a plurality of switches 21 to 28 which control input of a signal to the plurality of signal lines 11 to 18, which are included in a semiconductor device of this embodiment. Note that the switch 21 controls supply of an input signal (In1) to the signal line 11. Similarly, the switches 22 to 28 control supply of input signals (In2 to In8) to the signal lines 12 to 18. In addition, the plurality of signal lines 11 to 18 are arranged parallel or approximately parallel to one another. Further, a distance between the signal line 14 and the signal line 15 (G1) is longer than a distance between the signal line 13 and the signal line 14 (G0) and longer than a distance between the signal line 15 and the signal line 16 (G2). Note that in the semiconductor device of this embodiment, signals are supplied to the signal lines 11 to 18 only through the switches 21 to 28. Therefore, in the case where the switches 21 to 28 are in an off state, the signal lines 11 to 18 are in a floating state (also referred to as a high-impedance state).

Figure 1B:
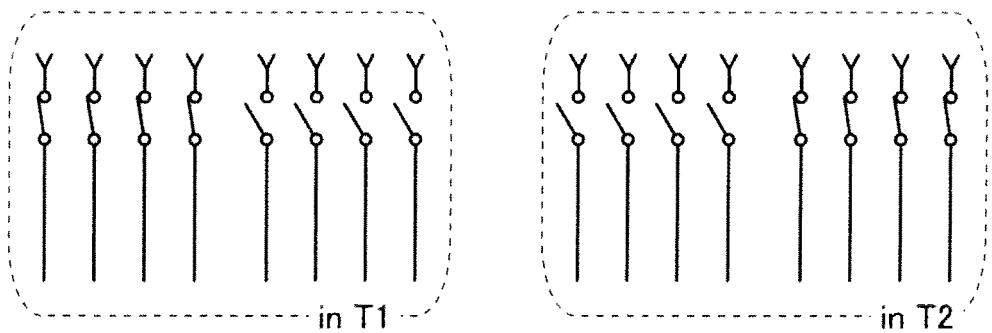

FIG. 1B illustrates operation of the switches 21 to 28 included in the semiconductor device in FIG. 1A. As illustrated in FIG. 1B, in a period T1, the switches 21 to 24 are in an on state and the switches 25 to 28 are in an off state. In a period T2, the switches 21 to 24 are in an off state and the switches 25 to 28 are in an on state.

In the semiconductor device illustrated in FIGS. 1A and 1B, a distance between two adjacent signal lines which go into a floating state in different periods (the distance between the signal line 14 and the signal line 15 (G1)) is longer than a distance between two adjacent signal lines which go into a floating state in the same period (the distance between the signal line 13 and the signal line 14 (G0) and the distance between the signal line 15 and the signal line 16 (G2)). Thus, the variation in potential of the signal line 14 or the signal line 15 due to capacitive coupling can be suppressed. Specifically, the variation in potential of the signal line 15 due to input of the input signal (In4) to the signal line 14 in the period T1 and the variation in potential of the signal line 14 due to input of the input signal (In5) to the signal line 15 in the period T2 can be suppressed.

Figure 1C:
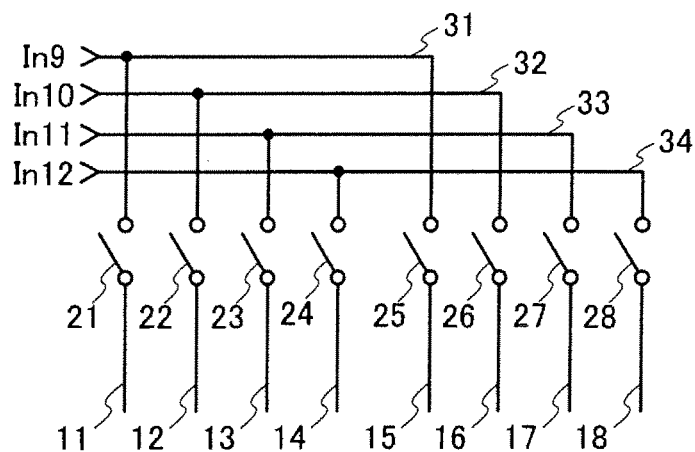

Note that supply of a signal to a plurality of signal lines through switches which are turned on in different periods can be performed with the use of the same wiring. For example, as illustrated in FIG. 1C, supply of a signal to the signal lines 11 and 15 can be performed with the use of a wiring 31. The same can be said for the pairs of the signal lines 12 and 16, the signal lines 13 and 17, and the signal lines 14 and 18. Supply of a signal to the signal lines 12 and 16 can be performed with the use of a wiring 32. Supply of a signal to the signal lines 13 and 17 can be performed with the use of a wiring 33. Supply of a signal to the signal lines 14 and 18 can be performed with the use of a wiring 34. That is to say, a signal supplied to the signal line 11 is an input signal (In9) input in the period T1, and a signal supplied to the signal line 15 is the input signal (In9) input in the period T2. Similarly, a signal supplied to the signal line 12 is an input signal (In10) input in the period T1, and a signal supplied to the signal line 16 is the input signal (In10) input in the period T2; a signal supplied to the signal line 13 is an input signal (In11) input in the period T1, and a signal supplied to the signal line 17 is the input signal (In11) input in the period T2; and a signal supplied to the signal line 14 is an input signal (In12) input in the period T1, and a signal supplied to the signal line 18 is the input signal (In12) input in the period T2.

Figure 2A:
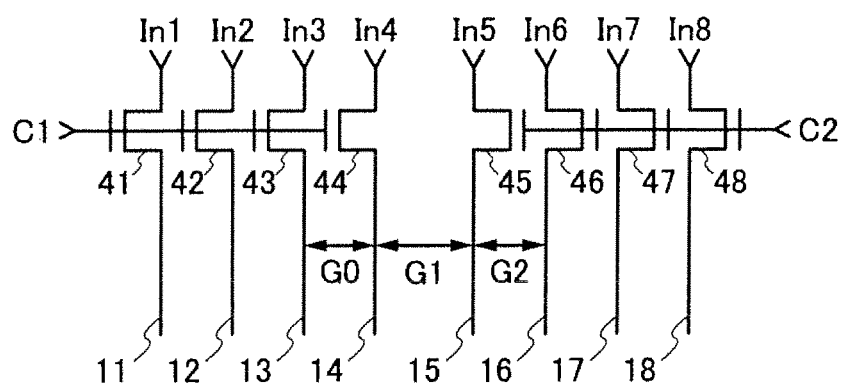
FIGS. 2A and 2B illustrate a semiconductor device in Embodiment 1.
Figure 2B:
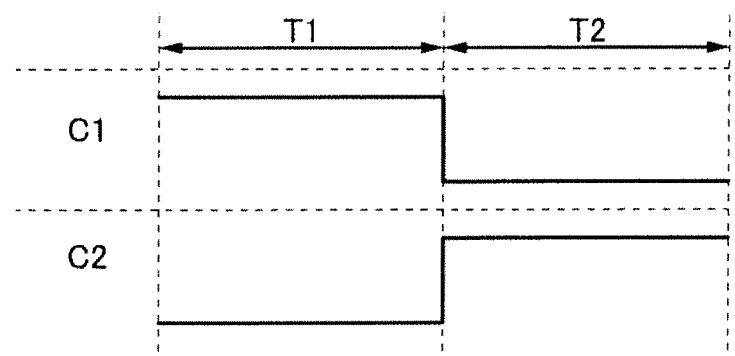

Further, as the switches 21 to 28, transistors can be used. FIG. 2A illustrates a diagram in which the switches 21 to 28 included in the semiconductor device in FIG. 1A are replaced with transistors. In a semiconductor device illustrated in FIG. 2A, gate terminals of transistors 41 to 44 are controlled by a control signal (C1), and gate terminals of transistors 45 to 48 are controlled by a control signal (C2). Note that here, the transistors 41 to 48 are n-channel transistors. FIG. 2B illustrates changes in potentials of the control signal (C1) and the control signal (C2). The control signal (C1) is a signal whose potential is at high level in the period T1 and at low level in the period T2. The control signal (C2) is a signal whose potential is at low level in the period T1 and at high level in the period T2. Thus, the transistors 41 to 44 can be in an on state in the period T1 and in an off state in the period T2, and the transistors 45 to 48 can be in an off state in the period T1 and in an on state in the period T2.

Figure 3A:
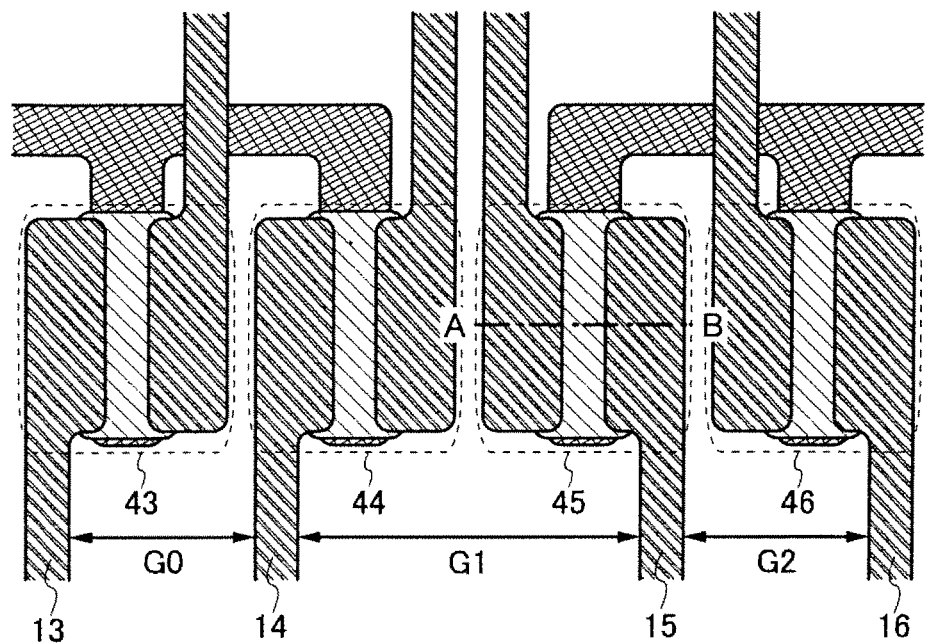
FIGS. 3A and 3B illustrate a semiconductor device in Embodiment 1.
Figure 3B:
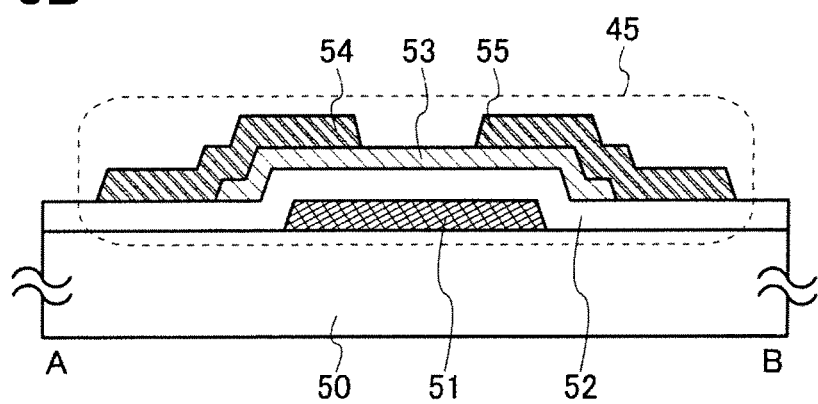

FIG. 3A is a plan view illustrating a specific structure of part of the semiconductor device illustrated in FIG. 2A. FIG. 3B is a cross-sectional view taken along line A-B in FIG. 3A. The transistor 45 illustrated in FIG. 3B includes a conductive layer 51 over a substrate 50, an insulating layer 52 over the substrate 50 and the conductive layer 51, a semiconductor layer 53 over the insulating layer 52, and a conductive layer 54 and a conductive layer 55 over the insulating layer 52 and the semiconductor layer 53. Note that in FIG. 3B, the conductive layer 51 serves as a gate terminal of the transistor 45, the insulating layer 52 serves as a gate insulating layer of the transistor 45, the conductive layer 54 serves as one of a source terminal and a drain terminal of the transistor 45, and the conductive layer 55 serves as the other of the source terminal and the drain terminal of the transistor 45. The structure of each of the transistors 43, 44, and 46 illustrated in FIG. 3A is the same or substantially the same as the structure of the transistor 45.

Note that examples of the substrate 50 include a semiconductor substrate (e.g., a single crystal substrate or a silicon substrate), an SOI substrate, a glass substrate, a quartz substrate, a conductive substrate whose top surface is provided with an insulating layer, flexible substrates such as a plastic substrate, a bonding film, paper containing a fibrous material, and a base film. Examples of a glass substrate include a barium borosilicate glass substrate, an alumino-borosilicate glass substrate, and a soda lime glass substrate. Examples of a flexible substrate include a flexible synthetic resin such as plastics typified by polyethylene terephthalate (PET), polyethylene naphthalate (PEN), and polyether sulfone (PES), and acrylic.

As the conductive layers 51, 54, and 55, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used.

As the insulating layer 52, an insulator such as silicon oxide, silicon nitride, silicon oxynitride, silicon nitride oxide, aluminum oxide, or tantalum oxide can be used. A stacked structure formed using these materials can also be used. Note that silicon oxynitride refers to a substance which contains more oxygen than nitrogen and contains oxygen, nitrogen, silicon, and hydrogen at given concentrations ranging from 55 atomic % to 65 atomic %, 1 atomic % to 20 atomic %, 25 atomic % to 35 atomic %, and 0.1 atomic % to 10 atomic %, respectively, where the total percentage of atoms is 100 atomic %. Further, silicon nitride oxide refers to a substance which contains more nitrogen than oxygen and contains oxygen, nitrogen, silicon, and hydrogen at given concentrations ranging from 15 atomic % to 30 atomic %, 20 atomic % to 35 atomic %, 25 atomic % to 35 atomic %, and 15 atomic % to 25 atomic %, respectively, where the total percentage of atoms is 100 atomic %.

The semiconductor layer 53 can be formed using any of the following semiconductor materials, for example: a material containing an element belonging to Group 14 of the periodic table, such as silicon (Si) or germanium (Ge), as its main component; a compound such as silicon germanium (SiGe) or gallium arsenide (GaAs); oxide such as zinc oxide (ZnO) or zinc oxide containing indium (In) and gallium (Ga); or an organic compound exhibiting semiconductor characteristics can be used. A stacked structure of layers formed using these semiconductor materials can also be used.

The channel length directions of the transistors 43 to 46 included in the semiconductor device illustrated in FIG. 3A are perpendicular or approximately perpendicular to the signal lines 13 to 16. In addition, one of a source terminal and a drain terminal of the transistor 44, which is farther from the transistor 45, is electrically connected to the signal line 14, and one of the source terminal and the drain terminal of the transistor 45, which is farther from the transistor 44, is electrically connected to the signal line 15. In other words, in the case where one of the source terminal and the drain terminal of the transistor 44 is closer to the transistor 45 than the other of the source terminal and the drain terminal of the transistor 44 and one of the source terminal and the drain terminal of the transistor 45 is closer to the transistor 44 than the other of the source terminal and the drain terminal of the transistor 45, the other of the source terminal and drain terminal of the transistor 44 is electrically connected to the signal line 14 and the other of the source terminal and the drain terminal of the transistor 45 is electrically connected to the signal line 15. Note that as illustrated in FIG. 3A, the source terminals and the drain terminals of the transistors 43 to 46 and the signal lines 13 to 16 are formed using the same conductive layer. Therefore, in the foregoing description, the other of the source terminal and the drain terminal of each of the transistors 44 and 45 can be expressed as part of each of the signal lines 14 and 15.

With the design illustrated in FIG. 3A, the distance between the signal line 14 and the signal line 15 (G1) can be made longer than the distance between the signal line 13 and the signal line 14 (G0) and the distance between the signal line 15 and the signal line 16 (G2). Thus, the variation in potential of the signal line 14 or the signal line 15 due to capacitive coupling can be suppressed.

Further, the structure illustrated in FIG. 3A can be realized by just selecting terminals electrically connected to signal lines in a plurality of transistors spaced at regular intervals or at approximately regular intervals. In other words, the structure illustrated in FIG. 3A is a structure in which a distance between signal lines can be adjusted through simple design. Therefore, in the case where an object is to make a distance between two adjacent signal lines which go into a floating state in different periods longer than a distance between two adjacent signal lines which go into a floating state in the same period, the object can be easily achieved with the structure illustrated in FIG. 3A. Thus, the structure illustrated in FIG. 3A is preferable.

The aforementioned semiconductor device is an example of an embodiment, and a semiconductor device which has a different point from the foregoing description is also included in this embodiment.

For example, although the aforementioned semiconductor device has the structure in which input of a signal is controlled in groups each including four signal lines as described above (see FIG. 1A), the number of signal lines in each group is not limited to four. The number of signal lines in each group may be any as long as it is a natural number of two or more.

Further, although the aforementioned semiconductor device has the structure in which the number of switches which are turned on in the period T1 is the same as the number of switches which are turned on in the period T2 (the structure including groups with the same number of switches) in the plurality of switches as described above (see FIG. 1B), the numbers of switches in the groups may be different from each other.

Figure 4A:
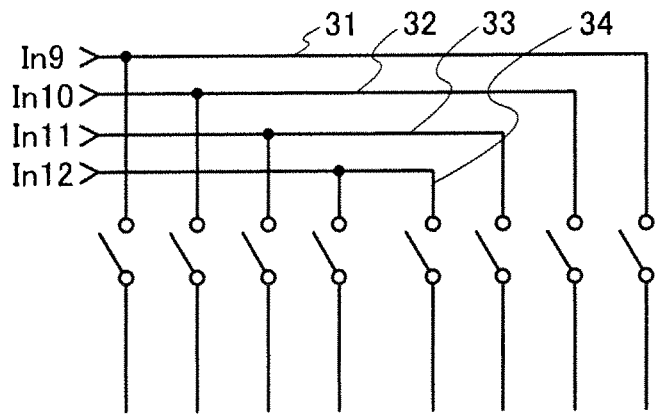
FIGS. 4A to 4C illustrate a semiconductor device in Embodiment 1.
Figure 4B:
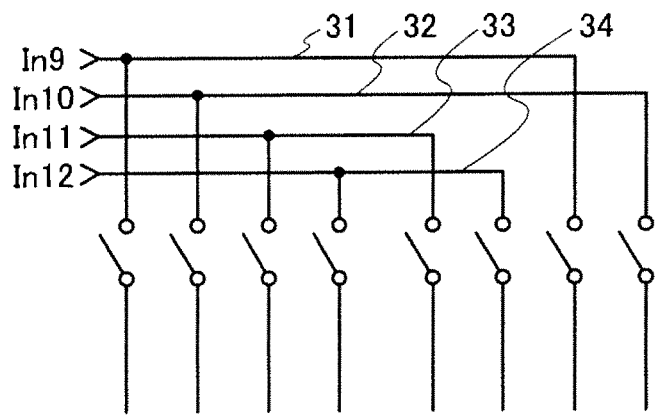
Figure 4C:
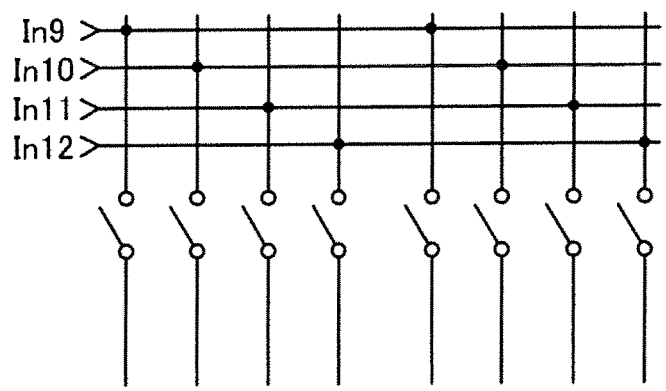

Furthermore, although the aforementioned semiconductor device has the structure in which, in the case of supplying a signal to a plurality of signal lines with the use of the same wiring, a signal is supplied to signal lines having the same position in their groups, with the use of the same wiring as described above (see FIG. 1C), signal lines to which a signal is supplied with the use of the same wiring may have different positions in their groups. Specifically, a signal may be supplied to a plurality of signal lines with the structures illustrated in FIGS. 4A and 4B. Further, each wiring may be extended as illustrated in FIG. 4C. Consequently, wiring resistances and parasitic capacitances in wirings can be leveled.

Figure 5A:
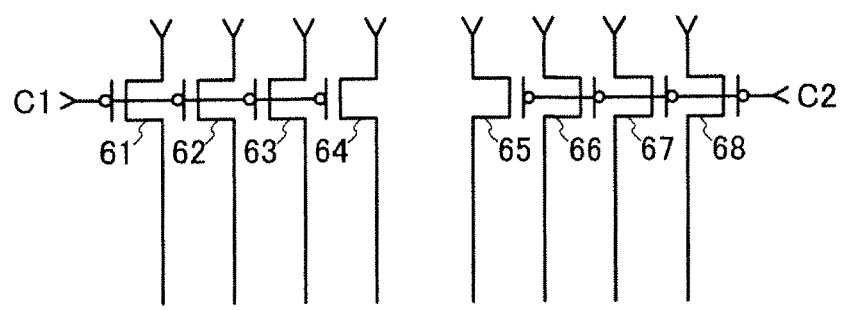
FIGS. 5A and 5B illustrate a semiconductor device in Embodiment 1.
Figure 5B:
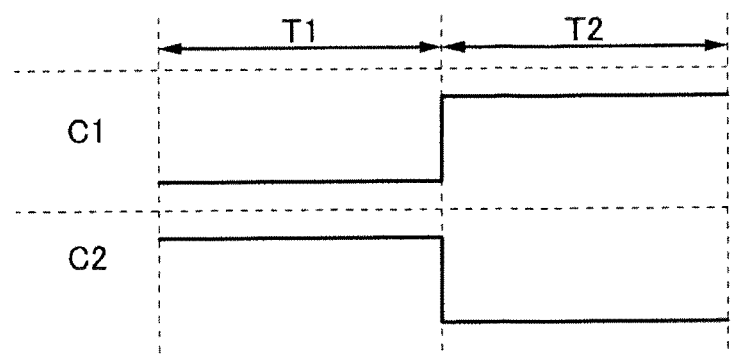

Moreover, in the above description, an example is illustrated in which n-channel transistors as the switches 21 to 28 in FIG. 1A are used in the aforementioned semiconductor device (see FIG. 2A). However, as illustrated in FIG. 5A, p-channel transistors 61 to 68 may be used as the switches 21 to 28 illustrated in FIG. 1A. Note that in the case where p-channel transistors are used as the switches, it is necessary that the control signal (C1) be at low level in the period T1 and at high level in the period T2, and the control signal (C2) be at high level in the period T1 and at low level in the period T2, as illustrated in FIG. 5B.

Figure 6A:
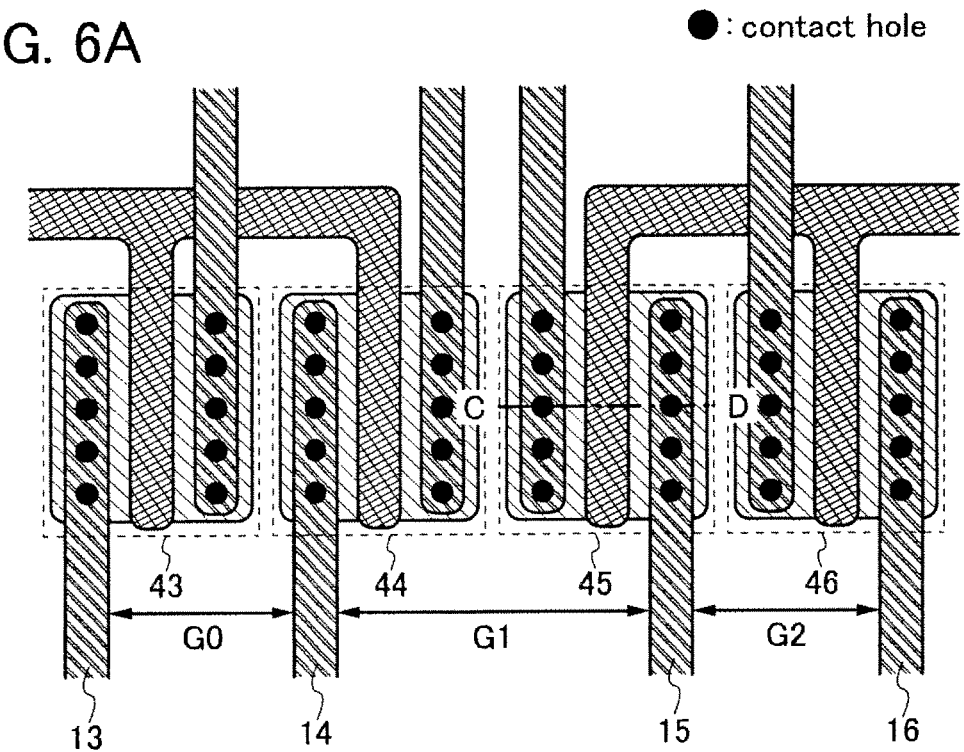
FIGS. 6A and 6B illustrate a semiconductor device in Embodiment 1.
Figure 6B:
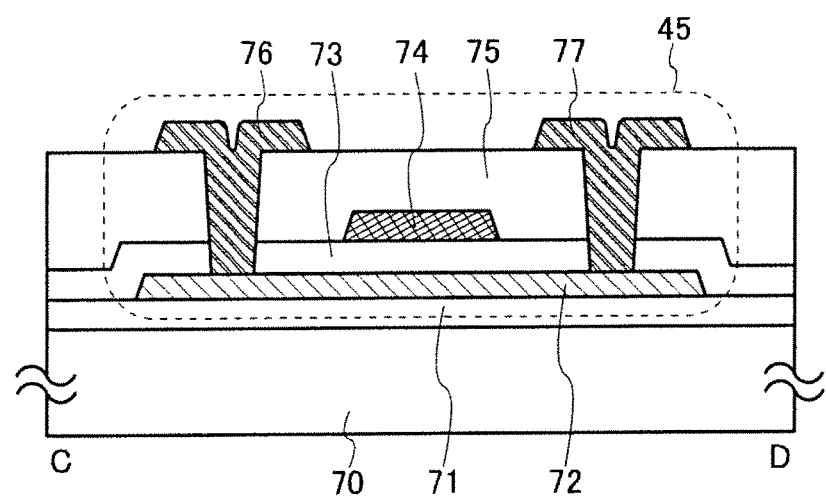

In addition, in the above description, an example is illustrated in which a transistor having a bottom-gate structure is used as a transistor in the aforementioned semiconductor device (see FIGS. 3A and 3B). However, the structure of the transistor is not limited to a bottom-gate structure. For example, a transistor having a top-gate structure, a transistor including gate terminals over and under a semiconductor layer, or the like can be used as the transistor. FIGS. 6A and 6B illustrate an example in which a transistor having a top-gate structure is used for a semiconductor device of this embodiment. Note that FIG. 6A is a plan view illustrating a specific structure of part of the semiconductor device illustrated in FIG. 2A, and FIG. 6B is a cross-sectional view taken along line C-D in FIG. 6A. A transistor 45 illustrated in FIG. 6B includes an insulating layer 71 over a substrate 70, a semiconductor layer 72 over the insulating layer 71, an insulating layer 73 over the semiconductor layer 72, a conductive layer 74 over the insulating layer 73, an insulating layer 75 over the insulating layer 73 and the conductive layer 74, and a conductive layer 76 and a conductive layer 77 in contact with the semiconductor layer through contact holes provided in the insulating layer 73 and the insulating layer 75. Note that in the transistor 45 illustrated in FIG. 6B, the conductive layer 74 serves as a gate terminal, the insulating layer 73 serves as a gate insulating layer, the conductive layer 76 serves as one of a source terminal and a drain terminal, and the conductive layer 77 serves as the other of the source terminal and the drain terminal. The structure of each of the transistors 43, 44, and 46 illustrated in FIG. 6A is the same or substantially the same as the structure of the transistor 45 illustrated in FIG. 6B.

Note that a material which is the same or substantially the same as that for the substrate 50 illustrated in FIG. 3B can be used for the substrate 70. Therefore, the foregoing description is to be referred to. Further, a material which is the same or substantially the same as that for the insulating layer 52 illustrated in FIG. 3B can be used for the insulating layers 71, 73, and 75; a material which is the same or substantially the same as that for the semiconductor layer 53 illustrated in FIG. 3B can be used for the semiconductor layer 72; and a material which is the same or substantially the same as that for the conductive layers 51, 54, and 55 illustrated in FIG. 3B can be used for the conductive layers 74, 76, and 77. Therefore, the foregoing description is to be referred to. Further, an organic material such as polyimide, polyamide, polyvinylphenol, benzocyclobutene, acrylic, or epoxy; a siloxane material such as a siloxane resin; an oxazole resin; or the like can also be used for the insulating layer 75. Note that a siloxane material corresponds to a material including a Si—O—Si bond. Siloxane includes a skeleton formed from a bond of silicon (Si) and oxygen (O). As a substituent, an organic group (e.g., an alkyl group or aromatic hydrocarbon) or a fluoro group may be used. The organic group may contain a fluoro group.

Figure 7:
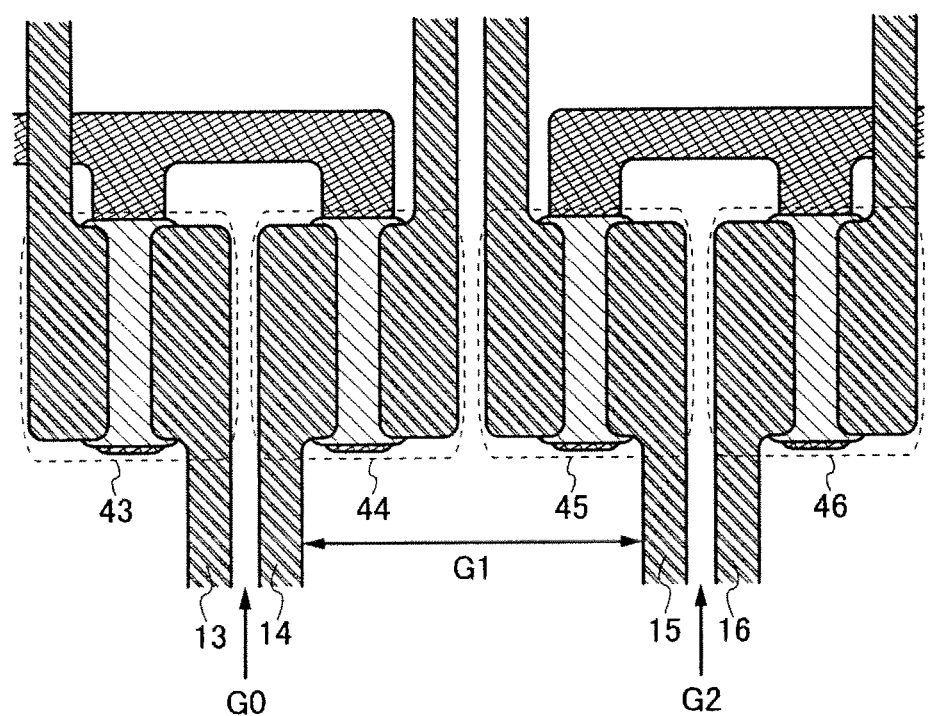
FIG. 7 illustrates a semiconductor device in Embodiment 1.

Further, in the aforementioned semiconductor device, the arrangement of signal lines which are in a floating state in the same period is not limited. That is to say, in transistors which are electrically connected to a plurality of signal lines which go into a floating state in the same period, which of a source terminal and a drain terminal in each transistor is electrically connected to each of the signal lines can be selected as appropriate. For example, a plurality of signal lines which go into a floating state in the same period can be divided into groups each including two signal lines, and the two signal lines can be electrically connected to the neighboring terminals of the adjacent transistors (see FIG. 7). Note that the structure illustrated in FIG. 7 is preferable for the semiconductor device in which a signal is supplied to a plurality of signal lines with the use of the same wiring (see FIG. 1C).

The reason is described in detail below. Here, one of a source terminal and a drain terminal of the transistor 43 is assumed to be a terminal electrically connected to the signal line 13, and the other of the source terminal and the drain terminal of the transistor 43 is assumed to be a terminal electrically connected to the wiring 33. In that case, the potential of the other of the source terminal and the drain terminal of the transistor 43 varies regardless of whether or not a signal is supplied to the signal line 13. At that time, a distance between the other of the source terminal and the drain terminal of the transistor 43 and the signal line 14 in the structure illustrated in FIG. 7 is longer than that in the structure illustrated in FIG. 3A. Therefore, with the structure illustrated in FIG. 7, the variation in potential of the signal line 14 due to capacitive coupling can be suppressed as compared to the structure illustrated in FIG. 3A. Thus, the structure illustrated in FIG. 7 is preferable.

Note that this embodiment or part of this embodiment can be freely combined with the other embodiments or part of the other embodiments.

Embodiment 2

In this embodiment, a semiconductor device of an embodiment of the present invention is described. Specifically, an example of an active matrix display device which performs data division driving is described with reference to FIGS. 8A and 8B, FIGS. 9A and 9B, FIG. 10, FIG. 11, and FIG. 12.

Figure 8A:
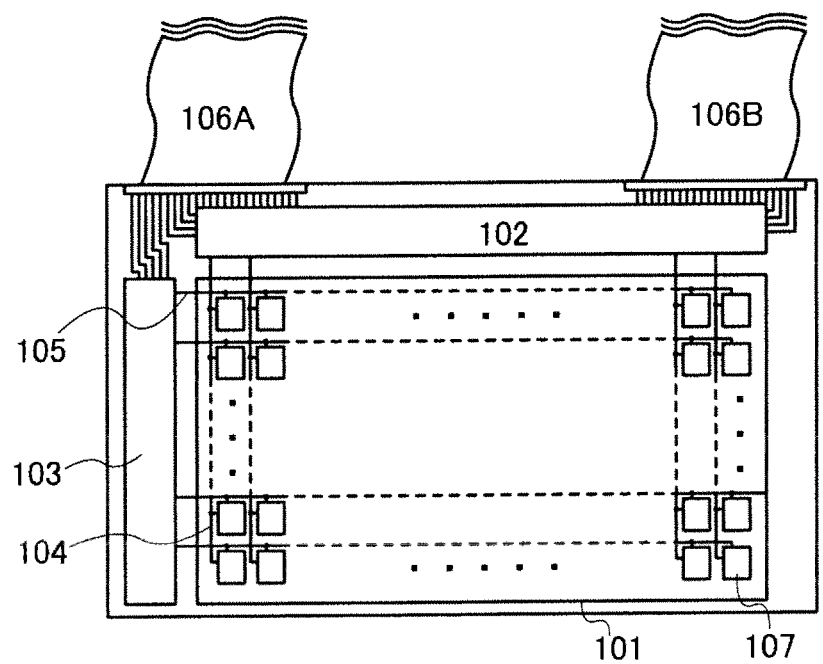
FIGS. 8A and 8B illustrate a semiconductor device in Embodiment 2.

FIG. 8A illustrates a structure example of an active matrix display device. A display device illustrated in FIG. 8A includes a pixel portion 101, a source signal line driver circuit 102, a gate signal line driver circuit 103, a plurality of source signal lines 104 which are arranged in parallel or approximately parallel, and a plurality of gate signal lines 105 which are arranged in parallel or approximately parallel. The pixel portion 101 includes a plurality of pixels 107. Note that the plurality of pixels 107 are arranged in matrix. Each of the plurality of source signal lines 104 is electrically connected to pixels in any column of the plurality of pixels arranged in matrix, and each of the plurality of gate signal lines 105 is electrically connected to pixels in any row of the plurality of pixels arranged in matrix. Note that signals (an image signal, a clock signal, a start signal, and the like) are input from the outside to the source signal line driver circuit 102 and the gate signal line driver circuit 103 through flexible printed circuits 106A and 106B.

Figure 8B:
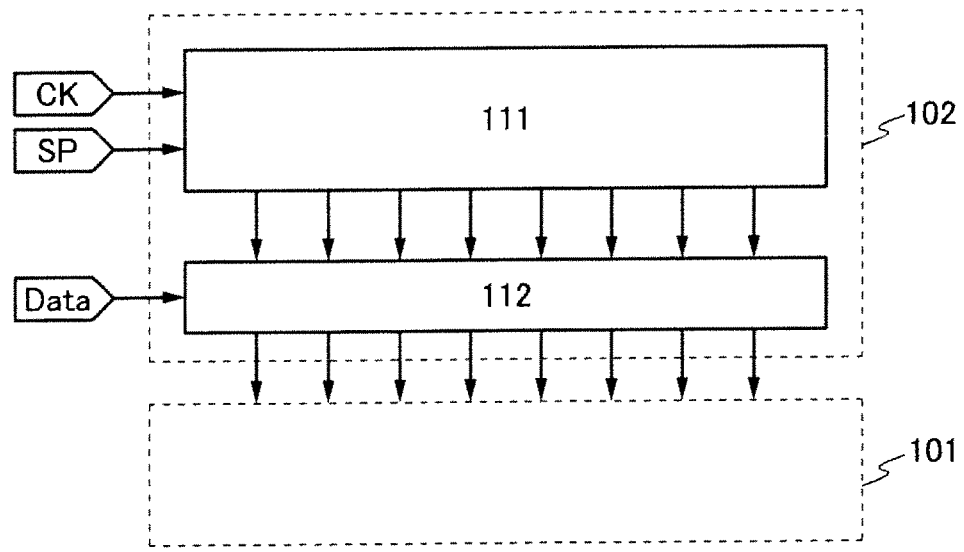

FIG. 8B illustrates a structure example of the source signal line driver circuit 102 in FIG. 8A. The source signal line driver circuit 102 illustrated in FIG. 8B includes a shift register circuit 111 and a sampling circuit 112. A clock signal (CK), a start signal (SP), and the like are input to the shift register circuit 111. An image signal (Data), a plurality of signals output from the shift register circuit 111, and the like are input to the sampling circuit 112. Note that the sampling circuit 112 outputs an image signal (Data) to the plurality of source signal lines arranged in the pixel portion 101.

Figure 9A:
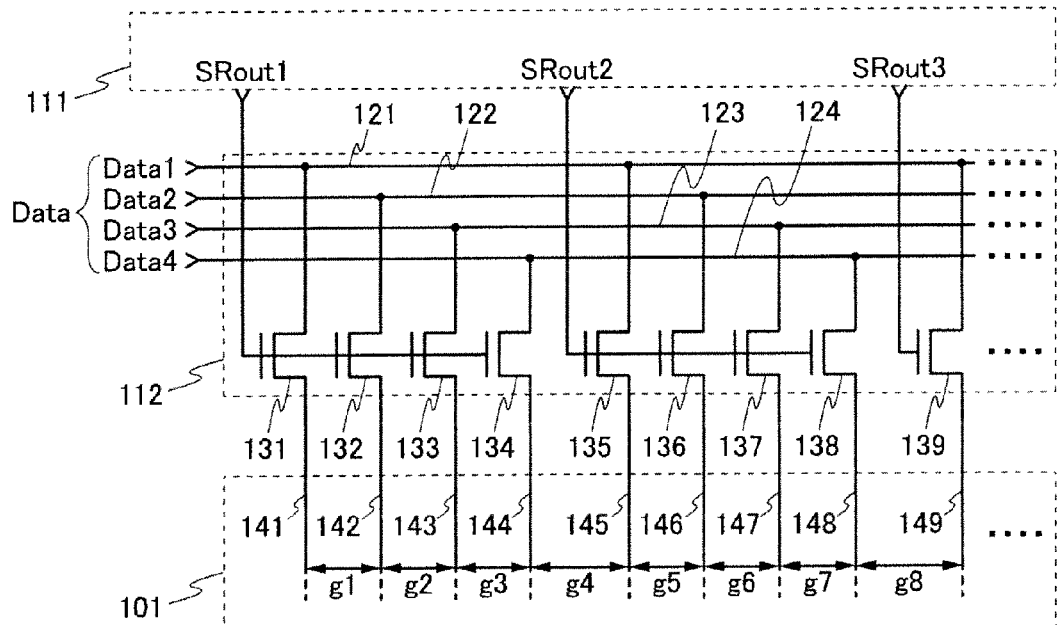
FIGS. 9A and 9B illustrate a semiconductor device in Embodiment 2.

FIG. 9A illustrates a structure example of the sampling circuit 112 illustrated in FIG. 8B. The sampling circuit 112 illustrated in FIG. 9A includes data signal lines 121 to 124 and transistors 131 to 139.

A signal input from the outside as an image signal (Data) is divided into four image signals, so that each of the four image signals has a frequency reduced to a quarter of that of the image signal (Data). Thus, image signals (Data 1 to Data 4) are obtained. Each of the data signal lines 121 to 124 supplies one of the image signals (Data 1 to Data 4).

Gate terminals of the transistors 131 to 134 are electrically connected to a terminal for outputting a signal (SRout1) which is one of the plurality of signals output from the shift register circuit 111. Gate terminals of the transistors 135 to 138 are electrically connected to a terminal for outputting a signal (SRout2) which is one of the plurality of signals output from the shift register circuit 111. A gate terminal of the transistor 139 is electrically connected to a terminal for outputting a signal (SRout3) which is one of the plurality of signals output from the shift register circuit 111.

One of a source terminal and a drain terminal of each of the transistors 131, 135, and 139 is electrically connected to the data signal line 121. One of a source terminal and a drain terminal of each of the transistors 132 and 136 is electrically connected to the data signal line 122. One of a source terminal and a drain terminal of each of the transistors 133 and 137 is electrically connected to a data signal line 123. One of a source terminal and a drain terminal of each of the transistors 134 and 138 is electrically connected to the data signal line 124.

The other of the source terminal and the drain terminal of each of the transistors 131 to 139 is electrically connected to any of source signal lines 141 to 149 arranged in parallel or approximately parallel in the pixel portion 101.

Note that a distance between the source signal line 144 and the source signal line 145 (g4) and a distance between the source signal line 148 and the source signal line 149 (g8) are longer than a distance between the other adjacent source signal lines (i.e., g1, g2, g3, g5, g6, or g7).

Figure 9B:
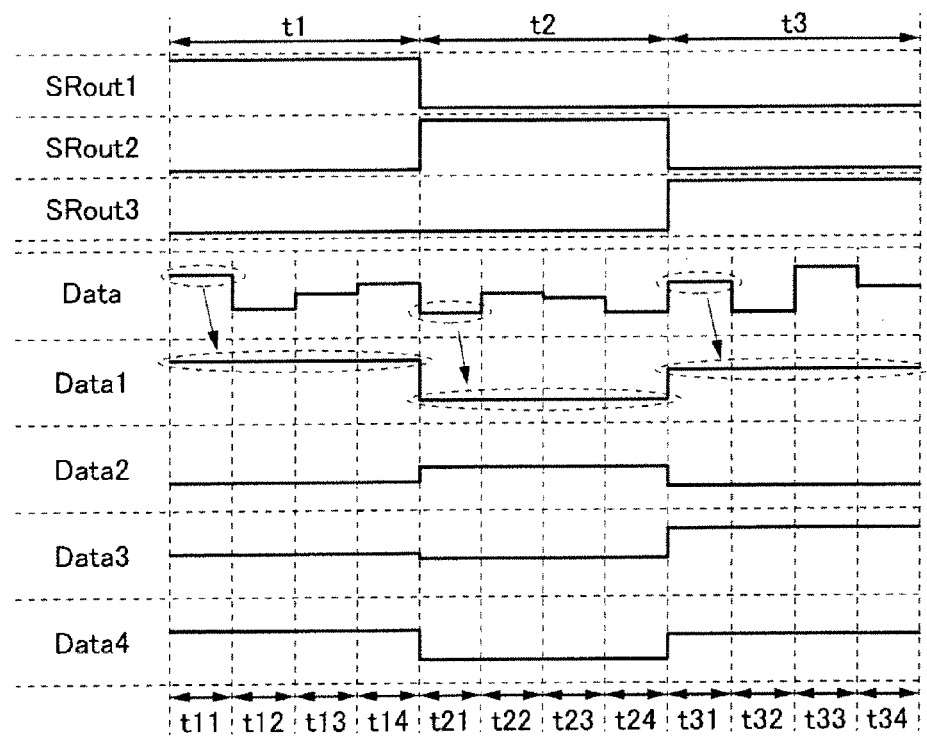

FIG. 9B illustrates a specific example of signals input to the sampling circuit 112 illustrated in FIG. 9A.

Specifically, a signal (SRout1) is a signal which is at high level in a period t1 and at low level in period t2 and period t3; a signal (SRout2) is a signal which is at high level in a period t2 and at low level in period t1 and period t3; and a signal (SRout3) is a signal which is at high level in a period t3 and at low level in period t1 and period t2. Note that the periods t1 to t3 have the same length.

An image signal (Data) is a signal which changes in potential level every period (periods t11 to t14, periods t21 to t24, and periods t31 to t34) obtained by dividing each of the periods t1 to t3 into quarters. Further, the image signal (Data1) is a signal which holds, in the period t1, a potential held by the image signal (Data) in the period t11; in the period t2, a potential held by the image signal (Data) in the period t21; and in the period t3, a potential held by the image signal (Data) in the period t31. The same can be said for the other image signals (Data2 to Data4). The image signal (Data2) is a signal which holds, in the period t1, a potential held by the image signal (Data) in the period t12; in the period t2, a potential held by the image signal (Data) in the period t22; and in the period t3, a potential held by the image signal (Data) in the period t32. The image signal (Data3) is a signal which holds, in the period t1, a potential held by the image signal (Data) in the period t13; in the period t2, a potential held by the image signal (Data) in the period t23; and in the period t3, a potential held by the image signal (Data) in the period t33. The image signal (Data4) is a signal which holds, in the period t1, a potential held by the image signal (Data) in the period t14; in the period t2, a potential held by the image signal (Data) in the period t24; and in the period t3, a potential held by the image signal (Data) in the period t34.

The semiconductor device of this embodiment performs data division driving with the aforementioned structure. More specifically, the image signal (Data) is divided into the four image signals (Data1 to Data4), and the image signals (Data1 to Data4) are concurrently supplied to four source signal lines, which are arranged in the pixel portion 101, every specific period (period t1, period t2, and period t3). Consequently, the operating frequency of the sampling circuit 112 (the transistors 131 to 139) can be reduced to a quarter of the operating frequency of a sampling circuit which successively supplies the image signal (Data) to each of the source signal lines.

Further, in the semiconductor device of this embodiment, a distance between two adjacent source signal lines (g4 or g8) which go into a floating state in different periods is longer than a distance between two adjacent source signal lines (g1, g2, g3, g5, g6, or g7) which go into a floating state in the same period. Therefore, the variation in potential of the source signal line 144, the source signal line 145, the source signal line 148, or the source signal line 149 due to capacitive coupling can be suppressed. Specifically, it is possible to suppress the variation in potential of the source signal line 145 due to input of the image signal (Data4) to the source signal line 144 in the period n, the variation in potential of the source signal line 144 due to input of the image signal (Data1) to the source signal line 145 in the period t2, the variation in potential of the source signal line 149 due to input of the image signal (Data4) to the source signal line 148 in the period t2, and the variation in potential of the source signal line 148 due to input of the image signal (Data1) to the source signal line 149 in the period t3. Consequently, formation of a stripe pattern in an image displayed on the semiconductor device of this embodiment can be suppressed.

Figure 10:
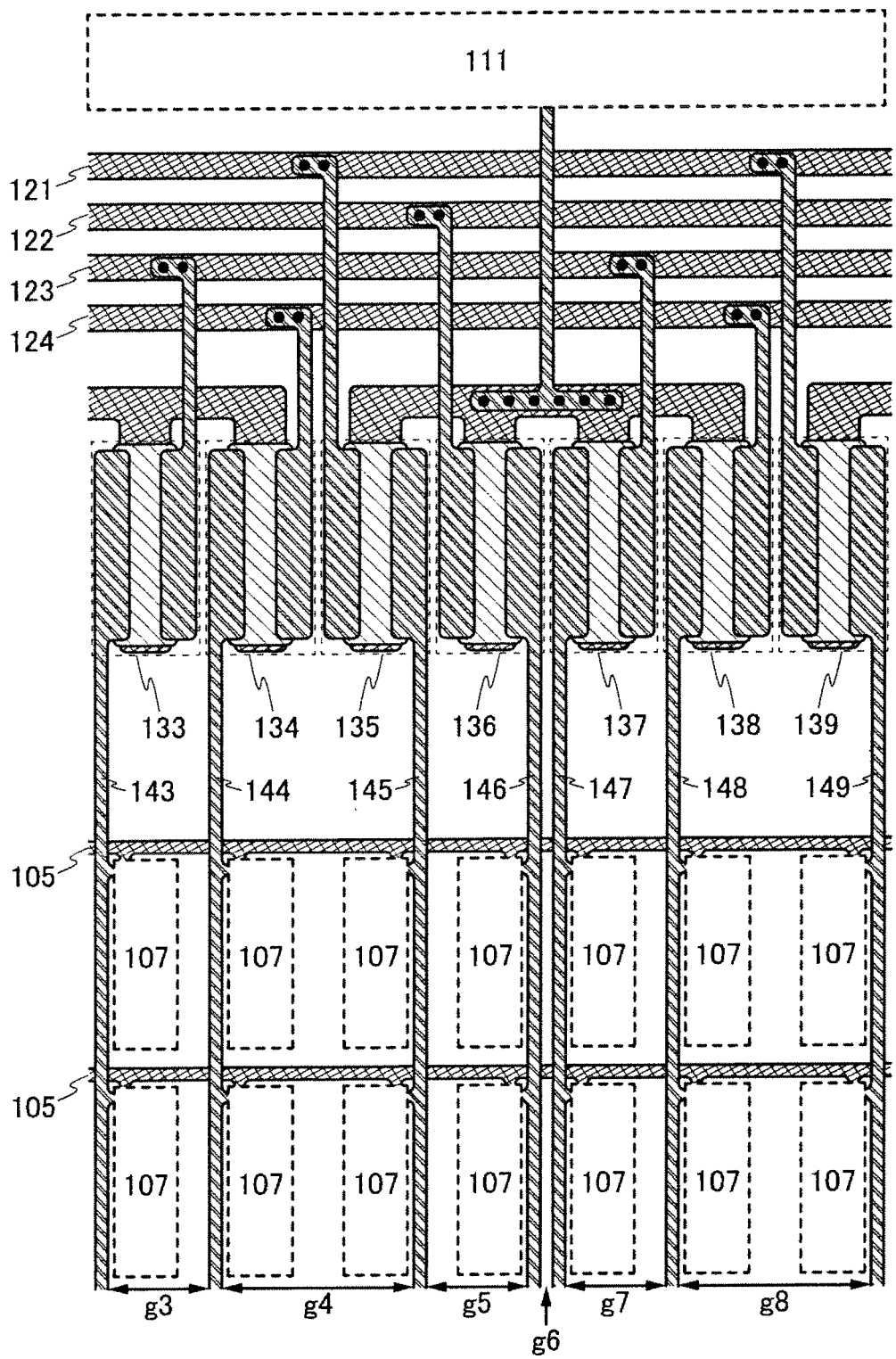
FIG. 10 illustrates a semiconductor device in Embodiment 2.

FIG. 10 is a plan view illustrating a specific structure of part of the semiconductor device in illustrated FIG. 9A. Note that a transistor illustrated in FIG. 10 is an inverted-staggered transistor (see FIGS. 3A and 3B).

Transistors 133 to 139 included in a semiconductor device illustrated in FIG. 10 are arranged such that channel length directions of the transistors 133 to 139 are perpendicular or approximately perpendicular to the source signal lines 143 to 149.

In addition, one of a source terminal and a drain terminal of the transistor 134, which is farther from the transistor 135, is electrically connected to the source signal line 144, and one of the source terminal and the drain terminal of the transistor 135, which is farther from the transistor 134, is electrically connected to the source signal line 145. In other words, in the case where one of the source terminal and the drain terminal of the transistor 134 is closer to the transistor 135 than the other of the source terminal and the drain terminal of the transistor 134 and one of the source terminal and the drain terminal of the transistor 135 is closer to the transistor 134 than the other of the source terminal and the drain terminal of the transistor 135, the other of the source terminal and drain terminal of the transistor 134 is electrically connected to the source signal line 144 and the other of the source terminal and the drain terminal of the transistor 135 is electrically connected to the source signal line 145.

Similarly, one of a source terminal and a drain terminal of the transistor 138, which is farther from the transistor 139, is electrically connected to the source signal line 148, and one of the source terminal and the drain terminal of the transistor 139, which is farther from the transistor 138, is electrically connected to the source signal line 149. In other words, in the case where one of the source terminal and the drain terminal of the transistor 138 is closer to the transistor 139 than the other of the source terminal and the drain terminal of the transistor 138 and one of the source terminal and the drain terminal of the transistor 139 is closer to the transistor 138 than the other of the source terminal and the drain terminal of the transistor 139, the other of the source terminal and drain terminal of the transistor 138 is electrically connected to the source signal line 148 and the other of the source terminal and the drain terminal of the transistor 139 is electrically connected to the source signal line 149.

Note that as illustrated in FIG. 10, the source terminals and the drain terminals of the transistors 133 to 139 and the signal lines 143 to 149 are formed using the same conductive layer. Therefore, in the foregoing description, the other of the source terminal and the drain terminal of each of the transistors 134, 135, 138, and 139 can be expressed as part of each of the source signal lines 144, 145, 148, and 149.

With the design illustrated in FIG. 10, the distance between the source signal line 144 and the source signal line 145 (g4) and the distance between the source signal line 148 and the source signal line 149 (g8) can be made longer than a distance between the other adjacent source signal lines (i.e., g1, g2, g3, g5, g6, or g7). Thus, the variation in potential of the source signal line 144, the source signal line 145, the source signal line 148, or the source signal line 149 due to capacitive coupling can be suppressed.

Further, the structure illustrated in FIG. 10 can be realized by just selecting terminals electrically connected to source signal lines in a plurality of transistors spaced at regular intervals or at approximately regular intervals. In other words, the structure illustrated in FIG. 10 is a structure in which a distance between source signal lines can be adjusted through simple design. Therefore, in the case where an object is to make a distance between two adjacent source signal lines which go into a floating state in different periods longer than a distance between two adjacent source signal lines which go into a floating state in the same period, the object can be easily achieved with the structure illustrated in FIG. 10. Thus, the structure illustrated in FIG. 10 is preferable.

The aforementioned semiconductor device is an example of an embodiment, and a semiconductor device which has a different point from the foregoing description is also included in this embodiment.

Figure 11:
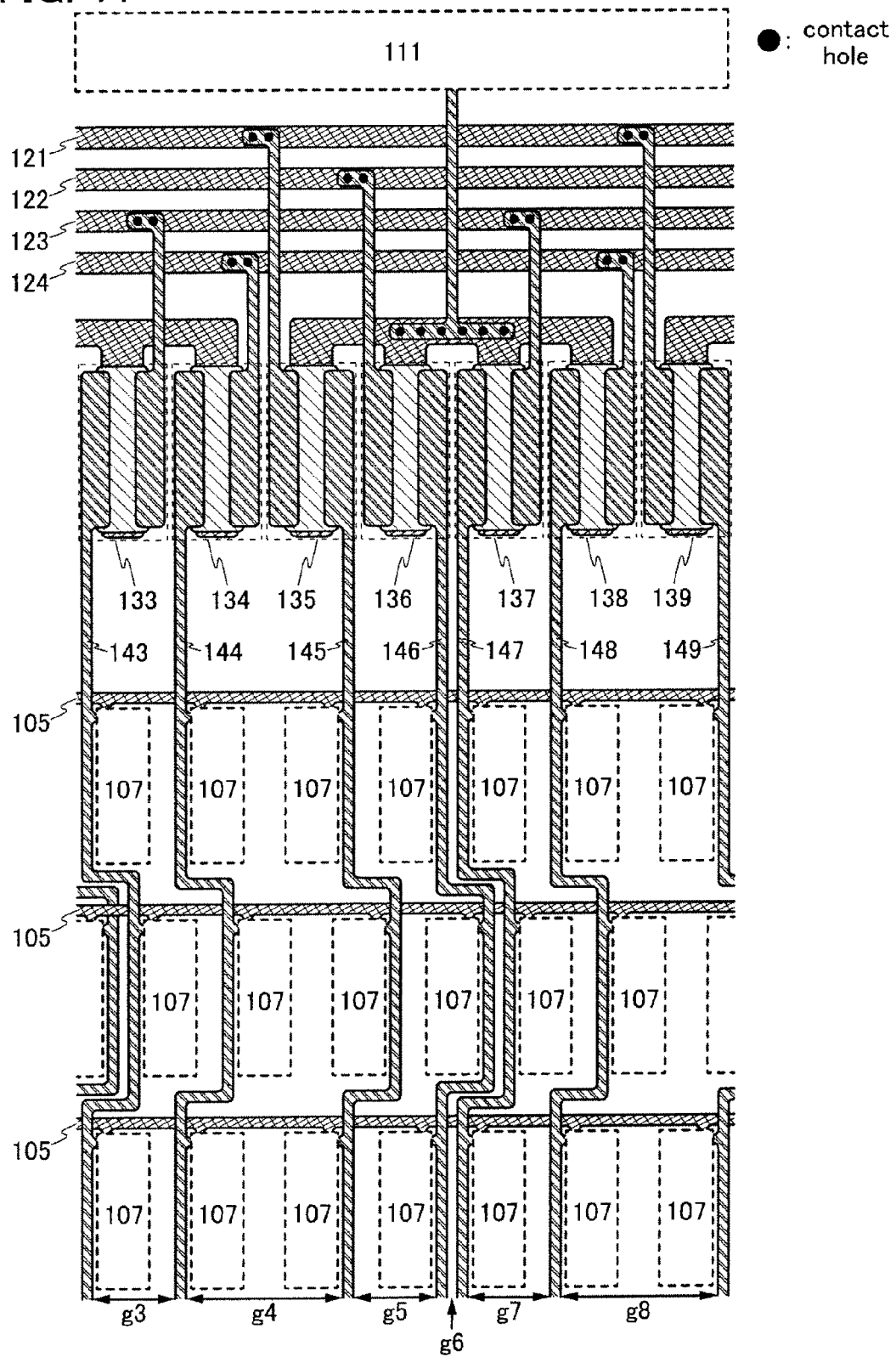
FIG. 11 illustrates a semiconductor device in Embodiment 2.

For example, although the aforementioned semiconductor device includes the plurality of pixels 107 arranged in a striped array (see FIG. 10), the plurality of pixels 107 may be arranged in a delta array (see FIG. 11).

Figure 12:
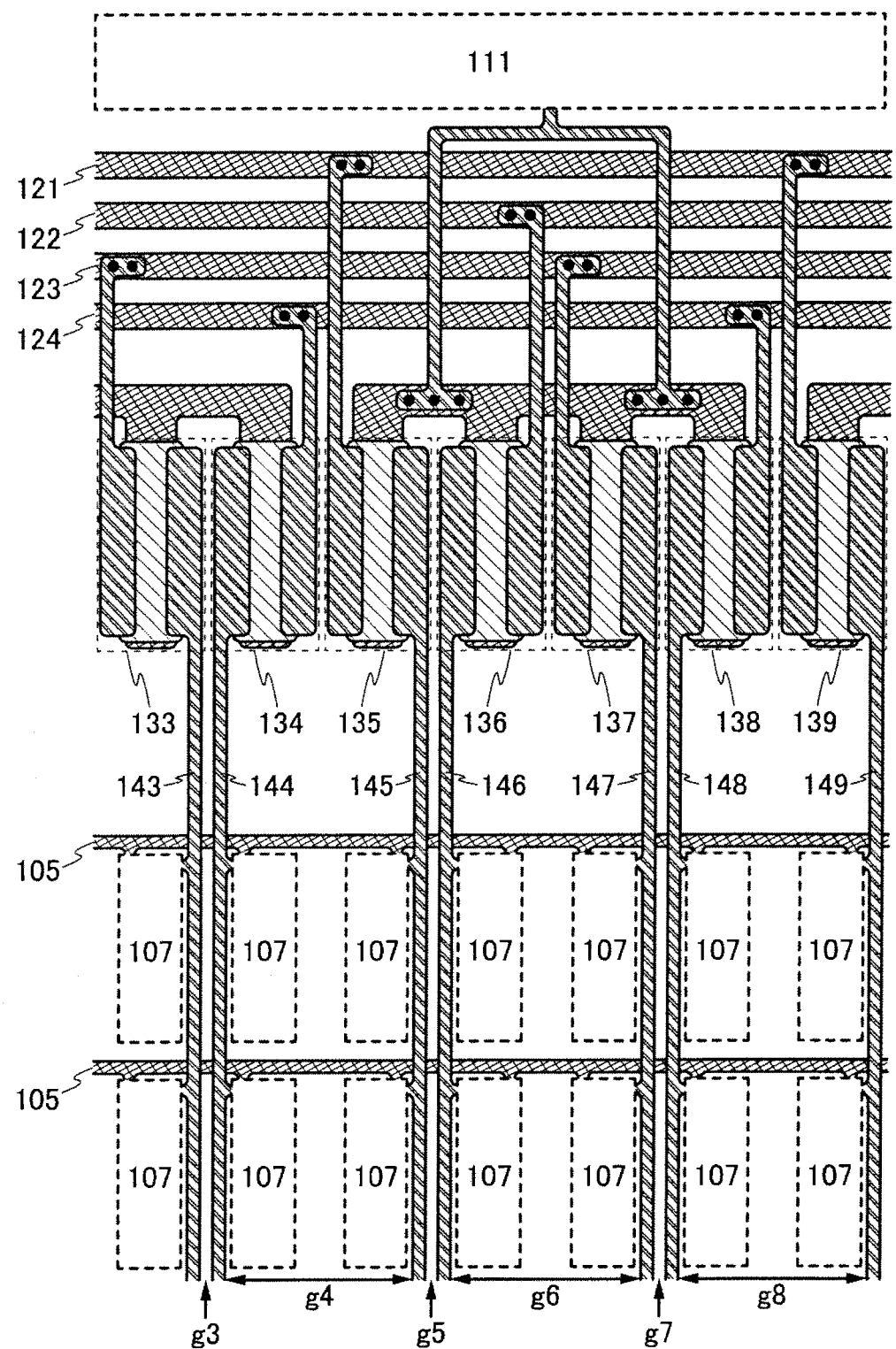
FIG. 12 illustrates a semiconductor device in Embodiment 2.

Further, in the aforementioned semiconductor device, the arrangement of source signal lines which go into a floating state in the same period is not limited. That is to say, in transistors which are electrically connected to a plurality of source signal lines which go into a floating state in the same period, which of a source terminal and a drain terminal in each transistor is electrically connected to each of the source signal lines can be selected as appropriate. For example, a plurality of source signal lines which go into a floating state in the same period can be divided into groups each including two source signal lines, and the two source signal lines can be electrically connected to the neighboring terminals of the adjacent transistors (see FIG. 12). Note that the structure illustrated in FIG. 12 is preferable for the semiconductor device in which a signal is supplied to a plurality of source signal lines with the use of the same wiring.

The reason is described in detail below. Here, one of the source terminal and the drain terminal of the transistor 133 is assumed to be a terminal electrically connected to the source signal line 143, and the other of the source terminal and the drain terminal of the transistor 133 is assumed to be a terminal electrically connected to the data signal line 123. In that case, the potential of the other of the source terminal and the drain terminal of the transistor 133 is changed regardless of whether or not a signal is supplied to the source signal line 143. At that time, a distance between the other of the source terminal and the drain terminal of the transistor 133 and the source signal line 144 in the structure illustrated in FIG. 12 is longer than that in the structures illustrated in each of FIG. 10 and FIG. 11. Therefore, with the structure illustrated in FIG. 12, the variation in potential of the source signal line 144 due to capacitive coupling can be suppressed as compared to the structures illustrated in FIG. 10 and FIG. 11. Thus, the structure illustrated in FIG. 12 is preferable.

Note that this embodiment or part of this embodiment can be freely combined with the other embodiments or part of the other embodiments.

Embodiment 3

In this embodiment, an example of a transistor included in the semiconductor device described in Embodiment 1 or Embodiment 2 will be described. Specifically, examples of a structure of a transistor whose channel formation region is formed using an oxide semiconductor and a method for manufacturing the transistor are described with reference to FIGS. 13A to 13D.

Figure 13A:
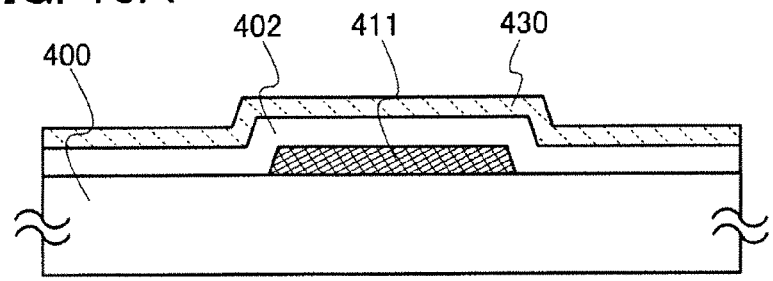
FIGS. 13A to 13D illustrate a transistor in Embodiment 3.
Figure 13B:
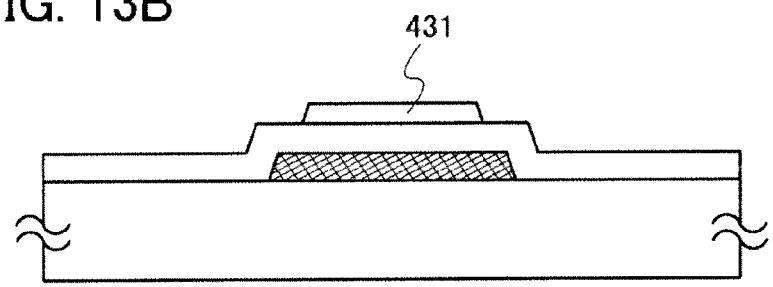
Figure 13C:
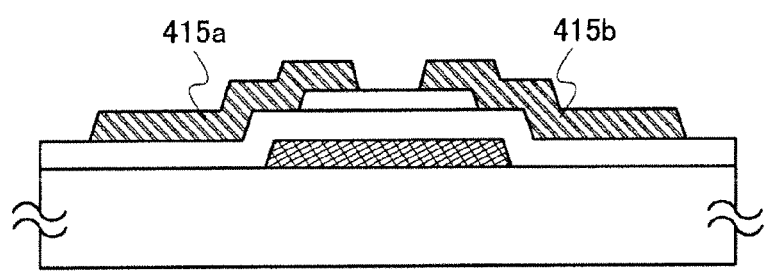
Figure 13D:
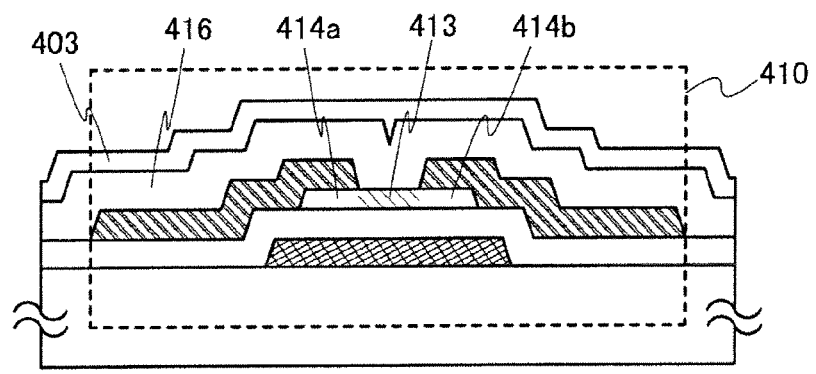

FIGS. 13A to 13D illustrate examples of a specific structure and a process for manufacturing the transistor in Embodiment 1. Note that a transistor 410 illustrated in FIG. 13D has a bottom-gate structure called a channel-etched type and is also referred to as an inverted-staggered transistor. Although a single-gate transistor is illustrated in FIG. 13D, a multi-gate transistor including a plurality of channel formation regions can be formed as needed.

A process for manufacturing the transistor 410 over a substrate 400 is described below with reference to FIGS. 13A to 13D.

First, a conductive film is formed over the substrate 400 having an insulating surface, and then, a gate electrode layer 411 is formed through a first photolithography step. Note that a resist mask used in the step may be formed by an inkjet method. Formation of the resist mask by an inkjet method needs no photomask; thus, manufacturing cost can be reduced.

Note that in this embodiment, the term "film" means something which is formed over an entire surface of a substrate and is to be processed into a desired shape in a subsequent photolithography step or the like, and something before the processing. The word "layer" means something obtained by processing and shaping a "film" into a desired shape by a photolithography step or the like, or something that is to be formed on the entire surface of a substrate.

Although there is no particular limitation on a substrate which can be used as the substrate 400 having an insulating surface, it is necessary that the substrate have at least enough heat resistance to a heat treatment to be performed later. For example, a glass substrate formed using barium borosilicate glass, aluminoborosilicate glass, or the like can be used. In the case where a glass substrate is used and the temperature at which the heat treatment is to be performed later is high, a glass substrate whose strain point is greater than or equal to 730° C. is preferably used.

Further, an insulating layer serving as a base layer may be provided between the substrate 400 and the gate electrode layer 411. The base layer has a function of preventing diffusion of an impurity element from the substrate 400, and can be formed with a single-layer structure or a layered structure using one or more of a silicon nitride film, a silicon oxide film, a silicon nitride oxide film, and a silicon oxynitride film.

The gate electrode layer 411 can be formed with a single-layer structure or a layered structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 411, the following structure is preferable: a structure in which a molybdenum layer is stacked over an aluminum layer, a structure in which a molybdenum layer is stacked over a copper layer, a structure in which a titanium nitride layer or a tantalum nitride layer is stacked over a copper layer, or a structure in which a titanium nitride layer and a molybdenum layer are stacked. As a three-layer structure, a three-layer structure of a tungsten layer or a tungsten nitride layer, a layer of an alloy of aluminum and silicon or an alloy of aluminum and titanium, and a titanium nitride layer or a titanium layer is preferable.

Then, a gate insulating layer 402 is formed over the gate electrode layer 411.

The gate insulating layer 402 can be formed with a single-layer structure or a layered structure using one or more of a silicon oxide layer, a silicon nitride layer, a silicon oxynitride layer, a silicon nitride oxide layer, and an aluminum oxide layer by a plasma CVD method, a sputtering method, or the like. For example, a silicon oxynitride layer may be formed using a deposition gas containing silane ($SiH_4$), oxygen, and nitrogen by a plasma CVD method. Furthermore, a high-k material such as hafnium oxide ($HfO_x$) or tantalum oxide ($TaO_x$) can be used as the gate insulating layer. The gate insulating layer 402 is formed to a thickness of 55 nm to 500 nm inclusive; in the case where the gate insulating layer 402 is formed with a layered structure, for example, a first gate insulating layer with a thickness of 50 nm to 200 nm inclusive and a second gate insulating layer with a thickness of 5 nm to 300 nm inclusive are stacked.

Here, a silicon oxynitride layer is formed as the gate insulating layer 402 to a thickness of 100 nm or less by a plasma CVD method.

Moreover, as the gate insulating layer 402, a silicon oxynitride layer may be formed with a high density plasma apparatus. Here, a high-density plasma apparatus refers to an apparatus which can realize a plasma density higher than or equal to $1 \times 10^{11}/cm^3$. For example, plasma is generated by applying a microwave power of 3 kW to 6 kW so that the insulating layer is formed.

A silane gas ($SiH_4$), nitrous oxide ($N_2O$), and a rare gas are introduced into a chamber as a source gas to generate high-density plasma at a pressure of 10 Pa to 30 Pa, and the insulating layer is formed over the substrate having an insulating surface, such as a glass substrate. After that, the supply of silane ($SiH_4$) is stopped, and a plasma treatment may be performed on a surface of the insulating layer by introducing nitrous oxide ($N_2O$) and a rare gas without exposure to the air. The plasma treatment performed on the surface of the insulating layer by introducing nitrous oxide ($N_2O$) and a rare gas is performed at least after the insulating layer is formed. The insulating layer formed through the above process procedure has a small thickness and corresponds to an insulating layer whose reliability can be ensured even though it has a thickness less than 100 nm, for example.

In forming the gate insulating layer 402, the flow ratio of silane ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating layer formed by using the high-density plasma apparatus can have certain thickness, the insulating layer has excellent step coverage. Further, as for the insulating layer formed by using the high-density plasma apparatus, the thickness of a thin film can be controlled precisely.

The insulating layer formed through the above process procedure is greatly different from the insulating layer formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating layer formed using the high-density plasma apparatus is a dense film.

An oxide semiconductor which is made to be intrinsic (i-type) or substantially intrinsic in a later step (a high-purity oxide semiconductor) is highly sensitive to an interface state and interface charge; thus, an interface between the oxide semiconductor and the gate insulating layer is important. Therefore, the gate insulating layer which is in contact with the high-purity oxide semiconductor needs high quality. Therefore, a high-density plasma CVD apparatus with use of microwaves (2.45 GHz) is preferably employed since formation of a dense and high-quality insulating film having high withstand voltage can be formed. When the high-purity oxide semiconductor and the high-quality gate insulating layer are in close contact with each other, the interface state density can be reduced and favorable interface characteristics can be obtained. It is important that the gate insulating layer have lower interface state density with an oxide semiconductor and a favorable interface as well as having favorable film quality as a gate insulating layer.

Then, an oxide semiconductor film 430 is formed to a thickness of 2 nm to 200 nm inclusive over the gate insulating layer 402. Note that before the oxide semiconductor film 430 is formed by a sputtering method, powdery substances (also referred to as particles or dust) which are attached on a surface of the gate insulating layer 402 are preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to modify a surface. Note that instead of an argon atmosphere, a nitrogen atmosphere, a helium atmosphere, an oxygen atmosphere, or the like may be used.

As the oxide semiconductor film 430, an In—Ga—Zn—O-based oxide semiconductor film, an In—Sn—O-based oxide semiconductor film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Ga—O-based oxide semiconductor film, an In—Zn—O-based oxide semiconductor film, an Sn—Zn—O-based oxide semiconductor film, an Al—Zn—O-based oxide semiconductor film, an. In—O-based oxide semiconductor film, an Sn—O-based oxide semiconductor film, or a Zn—O-based oxide semiconductor film is used. In this embodiment, the oxide semiconductor film 430 is formed by a sputtering method with the use of an In—Ga—Zn—O-based metal oxide target. A cross-sectional view of this stage is illustrated in FIG. 13A. Alternatively, the oxide semiconductor film 430 can be formed by a sputtering, method in a rare gas (typically argon) atmosphere, an oxygen atmosphere, or a mixed atmosphere containing a rare gas (typically argon) and oxygen. Note that when a sputtering method is used, it is preferable to perform deposition using a target including $SiO_2$ at 2 percent by weight or more and 10 percent by weight or less, include $SiO_x$ (X>0) which suppresses crystallization in the oxide semiconductor film 430, so that crystallization is suppressed when a heat treatment is performed for dehydration or dehydrogenation performed in a later process.

Here, film deposition is performed using a metal oxide target containing In, Ga, and Zn ($In_2O_3:Ga_2O_3:ZnO=1:1:1$ [mol], In:Ga:Zn=1:1:0.5 [atom]). The deposition condition is set as follows: the distance between the substrate and the target is 100 mm, the pressure is 0.2 Pa, the direct current (DC) power is 0.5 kW, and the atmosphere is a mixed atmosphere of argon and oxygen (argon:oxygen=30 sccm:20 sccm and the oxygen flow rate is 40%). Note that a pulse direct current (DC) power supply is preferable because powder substances generated at the time of deposition can be reduced and the film thickness can be made uniform. The In—Ga—Zn—O-based film is formed to a thickness of 2 nm to 200 nm inclusive. In this embodiment, as the oxide semiconductor film, a 20-nm-thick In—Ga—Zn—O-based film is formed by a sputtering method with the use of an In—Ga—Zn—O-based metal oxide target. As the metal oxide target containing In, Ga, and Zn, a target having a composition ratio of In:Ga:Zn=1:1:1 [atom] or a target having a composition ratio of In:Ga:Zn=1:1:2 [atom] can also be used.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering in which a voltage is also applied to a substrate during deposition.

Then, the oxide semiconductor film 430 is processed into an island-shaped oxide semiconductor layer through a second photolithography step. Note that a resist mask used in the step may be formed by an inkjet method. Formation of the resist mask by an inkjet method needs no photomask; thus, manufacturing cost can be reduced.

Next, dehydration or dehydrogenation of the oxide semiconductor layer is performed. The temperature of a first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is a kind of heat treatment apparatus, a heat treatment is performed on the oxide semiconductor layers in a nitrogen atmosphere at 450° C. for one hour, and then, the oxide semiconductor layer is not exposed to the air so that entry of water and hydrogen into the oxide semiconductor layer is prevented; thus, an oxide semiconductor layer 431 is obtained (see FIG. 13B).

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for a heat treatment using a high-temperature gas. As the gas, an inert gas which does not react with an object to be processed by a heat treatment, such as nitrogen or a rare gas such as argon is used.

For example, as the first heat treatment, GRTA by which the substrate is moved into an inert gas heated to a temperature as high as 650° C. to 700° C., heated for several minutes, and moved out of the inert gas heated to the high temperature may be performed. With GRTA, a high-temperature heat treatment for a short period of time can be achieved.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

The first heat treatment performed on the oxide semiconductor layer may be performed on the oxide semiconductor film 430 which has not yet been processed into the island-shaped oxide semiconductor layer. In that case, after the first heat treatment, the substrate is extracted from the heat treatment apparatus, and then the second photolithography step is performed.

The heat treatment for dehydration or dehydrogenation of the oxide semiconductor layer may be performed at any of the following timings: after the oxide semiconductor layer is formed; after a source electrode layer and a drain electrode layer are formed over the oxide semiconductor layer; and after a protective insulating film is formed over the source electrode layer and the drain electrode layer.

Further, in the case where an opening portion is formed in the gate insulating layer 402, the step of forming the opening portion may be performed either before or after the oxide semiconductor film 430 is subjected to dehydration or dehydrogenation treatment.

Note that the etching of the oxide semiconductor film 430 is not limited to wet etching, and dry etching may also be used.

As the etching gas for dry etching, a gas including chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, a metal conductive film is formed over the gate insulating layer 402 and the oxide semiconductor layer 431. The metal conductive film may be formed by a sputtering method or a vacuum evaporation method. As a material of the metal conductive film, an element selected from aluminum (Al), chromium (Cr), copper (Cu), tantalum (Ta), titanium (Ti), molybdenum (Mo), and tungsten (W), an alloy containing any of these elements as a component, an alloy containing any of these the elements in combination, or the like can be given. Alternatively, one or more materials selected from manganese (Mn), magnesium (Mg), zirconium (Zr), beryllium (Be), and yttrium (Y) may be used. Further, the metal conductive film may have a single-layer structure or a layered structure of two or more layers. For example, the following structures can be given: a single-layer structure of an aluminum film including silicon, a single-layer structure of a copper film, or a film including copper as a main component, a two-layer structure in which a titanium film is stacked over an aluminum film, a two-layer structure in which a copper film is stacked over a tantalum nitride film or a copper nitride film, and a three-layer structure in which an aluminum film is stacked over a titanium film and another titanium film is stacked over the aluminum film. Alternatively, a film, an alloy film, or a nitride film which contains aluminum (Al) and one or more of elements selected from titanium (Ti), tantalum (Ta), tungsten (W), molybdenum (Mo), chromium (Cr), neodymium (Nd), and scandium (Sc) may be used.

If a heat treatment is performed after formation of the metal conductive film, it is preferable that the metal conductive film have heat resistance enough to withstand the heat treatment.

A third photolithography step is performed. A resist mask is formed over the metal conductive film and etching is selectively performed, so that a source electrode layer 415*a* and a drain electrode layer 415*b* are formed. Then, the resist mask is removed (see FIG. 13C).

Note that materials and etching conditions are adjusted as appropriate so that the oxide semiconductor layer 431 is not removed by etching of the metal conductive film.

Here, a titanium film is used as the metal conductive film, an In—Ga—Zn—O based oxide is used for the oxide semiconductor layer 431, and an ammonia hydrogen peroxide mixture (a mixed solution of ammonia, water, and a hydrogen peroxide solution) is used.

Note that, in the third photolithography step, only a part of the oxide semiconductor layer 431 is etched, whereby an oxide semiconductor layer having groove (depressed portions) is formed in some cases. Alternatively, the resist mask used in the step may be formed by an inkjet method. Formation of the resist mask by an inkjet method needs no photomask; thus, manufacturing cost can be reduced.

In order to reduce the number of photomasks used in a photolithography step and reduce the number of photolithography steps, an etching step may be performed with the use of a multi-tone mask which is a light-exposure mask through which light is transmitted to have a plurality of intensities. Since a resist mask formed using a multi-tone mask has a plurality of thicknesses and can be further changed in shape by performing ashing, the resist mask can be used in a plurality of etching steps to provide different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, plasma treatment using a gas such as nitrous oxide ($N_2O$), nitrogen ($N_2$), or argon (Ar) is performed. By this plasma treatment, water and the like absorbed onto an exposed surface of the oxide semiconductor layer are removed. Plasma treatment may be performed using a mixture gas of oxygen and argon as well.

After the plasma treatment, an oxide insulating layer 416 which serves as a protective insulating film and is in contact with part of the oxide semiconductor layer is formed without exposure to the air.

The oxide insulating layer 416, which has a thickness of at least 1 nm or more, can be formed as appropriate by a sputtering method or the like, that is a method with which impurities such as water and hydrogen are not mixed into the oxide insulating layer 416. When hydrogen is contained in the oxide insulating layer 416, entry of the hydrogen to the oxide semiconductor layer is caused, thereby making a backchannel of the oxide semiconductor layer 431 have a lower resistance (have n-type conductivity) and forming parasitic channels. Therefore, it is important that a formation method in which hydrogen is not used is employed in order to form the oxide insulating layer 416 containing as little hydrogen as possible.

Here, a 200-nm-thick silicon oxide film is deposited as the oxide insulating layer 416 by a sputtering method. The substrate temperature in deposition may be higher than or equal to a room temperature and lower than or equal to 300° C. and in this embodiment, is 100° C. Formation of a silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target may be used. For example, the silicon oxide film can be formed using a silicon target by a sputtering method in an atmosphere including oxygen and nitrogen.

Next, a second heat treatment is performed, preferably in an inert gas atmosphere or an oxygen gas atmosphere (preferably at 200° C. to 400° C. inclusive, more preferably at 250° C. to 350° C. inclusive). For example, the second heat treatment is performed in a nitrogen atmosphere at 250° C. for one hour. Through the second heat treatment, part of the oxide semiconductor layer (a channel formation region) is heated while being in contact with the oxide insulating layer 416. Thus, oxygen is supplied to part of the oxide semiconductor layer (a channel formation region).

Through the above process procedure, the oxide semiconductor layer is subjected to the heat treatment for dehydration or dehydrogenation, and then, part of the oxide semiconductor layer (a channel formation region) is selectively made to be in an oxygen excess state. As a result, a channel formation region 413 overlapping with the gate electrode layer 411 becomes i-type, and a source region 414a overlapping with the source electrode layer 415a and a drain region 414b overlapping with the drain electrode layer 415b are formed in a self-aligned manner. Thus, the transistor 410 is formed.

In a gate bias-temperature stress test (BT test) at 85° C. with $2 \times 10^6$ V/cm for 12 hours, if an impurity is added to an oxide semiconductor, a bond between the impurity and a main component of the oxide semiconductor is broken by a high electric field (B: bias) and high temperature (T: temperature), and a generated dangling bond causes a drift of the threshold voltage ($V_{th}$). On the other hand, by removing impurities in an oxide semiconductor as much as possible, especially hydrogen or water and using the high-density plasma CVD apparatus, a dense and high-quality insulating film with high withstand voltage and good interface characteristics between the insulating film and an oxide semiconductor as described above can be obtained; thus, a transistor which is stable even in the BT test can be obtained.

Further, heat treatment may be performed at 100° C. to 200° C. inclusive for one hour to 30 hours inclusive in the air. Here, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Further, this heat treatment may be performed before formation of the oxide insulating film under a reduced pressure. Under the reduced pressure, the heat treatment time can be shortened. By the heat treatment, hydrogen is taken in the oxide insulating layer from the oxide semiconductor layer.

By the formation of the drain region 414b in part of the oxide semiconductor layer, which overlaps with the drain electrode layer 415b, reliability of the transistor can be improved. Specifically, by the formation of the drain region 414b, a structure in which conductivity can be varied from the drain electrode layer 415b to the channel formation region 413 through the drain region 414b can be obtained.

Further, the source region or the drain region in the oxide semiconductor layer is formed in the entire thickness direction in the case where the thickness of the oxide semiconductor layer is 15 nm or less. In the case where the thickness of the oxide semiconductor layer is 30 nm to 50 nm inclusive, in part of the oxide semiconductor layer, that is, in a region in the oxide semiconductor layer, which is in contact with the source electrode layer or the drain electrode layer, and the vicinity thereof, resistance is reduced and the source region or the drain region is formed, while a region in the oxide semiconductor layer, which is close to the gate insulating layer, can be made to be i-type.

A protective insulating layer may be further formed over the oxide insulating layer 416. For example, a silicon nitride film is formed by an RF sputtering method. Since an RF sputtering method has high productivity, it is preferably used as a film formation method of the protective insulating layer. As the protective insulating layer, an inorganic insulating film which does not include impurities such as moisture, a hydrogen ion, and OH⁻ and blocks entry of these from the outside is used; a silicon nitride film, an aluminum nitride film, a silicon nitride oxide film, an aluminum oxynitride film, or the like is used. In this embodiment, as the protective insulating layer, a protective insulating layer 403 is formed using a silicon nitride film (see FIG. 13D).

The transistor described in this embodiment is a transistor which can be formed over a glass substrate (which can be formed by a low-temperature process). Further, the field-effect mobility of the transistor described in this embodiment is higher than that of a transistor whose channel formation region is formed using amorphous silicon. Therefore, the transistor described in this embodiment is preferable as a transistor in each pixel in an active matrix display device.

Meanwhile, the field-effect mobility of the transistor whose channel formation region is formed using an oxide semiconductor is lower than a transistor whose channel formation region is formed using single crystal silicon. Therefore, in an active matrix display device in which a transistor whose channel formation region is formed using single crystal silicon is used as a transistor included in a driver circuit, it is difficult to replace a transistor included in the driver circuit with a transistor whose channel formation region is formed using an oxide semiconductor.

However, by data division driving, the operating frequency of a driver circuit can be reduced as described in Embodiment 2 or the like. Thus, the range of application of the transistor can be expanded; for example, the transistor described in this embodiment can be used as a transistor included in a driver circuit. Consequently, manufacturing cost of an active matrix display device can be reduced and the display device can be reduced in size and weight.

Specifically, the transistor of this embodiment can be used as the transistor included in the sampling circuit and the transistor included in each pixel, in the active matrix display device described in Embodiment 2. In addition, the transistor in this embodiment can be used as a transistor included in a gate signal line driver circuit or in part of the circuit or/and a transistor included in a circuit of a source signal line driver circuit other than a sampling circuit (e.g., a shift register circuit) or in part of the circuit. Naturally, it is preferable to expand the range of application of the transistor of this embodiment because the expansion of the range promotes reduction of manufacturing cost of the display device and reduction in size and weight of the display device.

Note that the contents of this embodiment or part thereof can be combined freely with the contents of other embodiments or part thereof or the content of Example or part thereof.

Embodiment 4

In this embodiment, examples of an electronic device on which the semiconductor device in Embodiment 1 or Embodiment 2 is mounted are described with reference to FIGS. 14A to 14F.

Figure 14A:
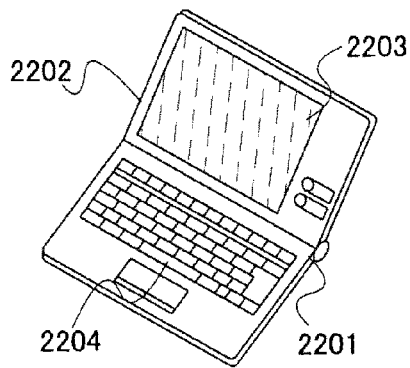
FIGS. 14A to 14F illustrate electronic devices in Embodiment 4.

FIG. 14A illustrates a laptop computer, which includes a main body 2201, a housing 2202, a display portion 2203, a keyboard 2204, and the like.

Figure 14B:
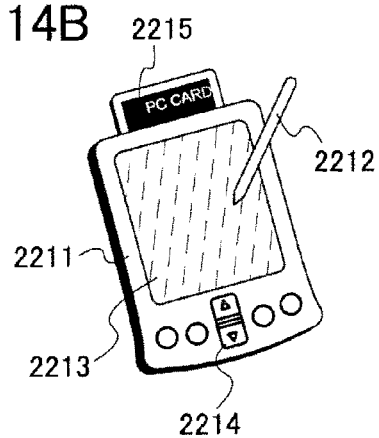

FIG. 14B illustrates a personal digital assistant (PDA), which includes a main body 2211 having a display portion 2213, an external interface 2215, an operation button 2214, and the like. A stylus 2212 for operation is included as an accessory.

Figure 14C:
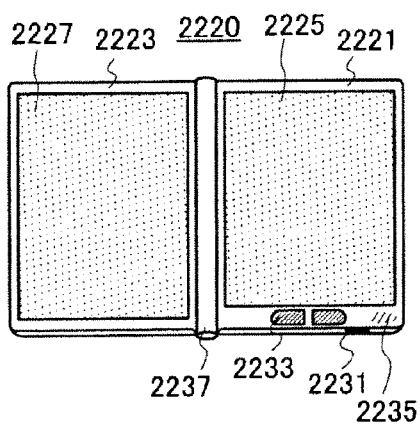

FIG. 14C illustrates an e-book reader 2220 as an example of electronic paper. The e-book reader 2220 includes two housings: housings 2221 and 2223. The housings 2221 and 2223 are bound with each other by a hinge 2237, along which the e-book reader 2220 can be opened and closed. With such a structure, the e-book reader 2220 can be used as a paper book.

A display portion 2225 is incorporated in the housing 2221, and a display portion 2227 is incorporated in the housing 2223. The display portion 2225 and the display portion 2227 may display one image or different images. In the structure where the display portions display different images from each other, for example, the right display portion (the display portion 2225 in FIG. 14C) can display text and the left display portion (the display portion 2227 in FIG. 14C) can display images.

Further, in FIG. 14C, the housing 2221 is provided with an operation portion and the like. For example, the housing 2221 is provided with a power button 2231, an operation key 2233, a speaker 2235, and the like. With the operation key 2233, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 2220 may have a function of an electronic dictionary.

The e-book reader 2220 may be configured to transmit and receive data wirelessly. Through wireless communication, desired book data or the like can be purchased and downloaded from an electronic book server.

Note that electronic paper can be applied to devices in a variety of fields as long as they display information. For example, electronic paper can be used for posters, advertisement in vehicles such as trains, display in a variety of cards such as credit cards, and the like in addition to e-book readers.

Figure 14D:
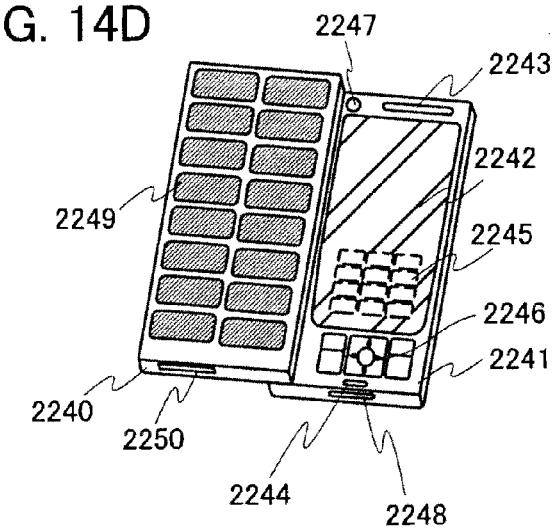

FIG. 14D illustrates a mobile phone. The mobile phone includes two housings: housings 2240 and 2241. The housing 2241 is provided with a display panel 2242, a speaker 2243, a microphone 2244, a pointing device 2246, a camera lens 2247, an external connection terminal 2248, and the like. The housing 2240 is provided with a solar cell 2249 which charges the mobile phone, an external memory slot 2250, and the like. An antenna is incorporated in the housing 2241.

The display panel 2242 has a touch panel function. A plurality of operation keys 2245 which are displayed as images is illustrated by dashed lines in FIG. 14D. Note that the mobile phone includes a booster circuit for increasing a voltage output from the solar cell 2249 to a voltage needed for each circuit. Moreover, the mobile phone can include a contactless IC chip, a small recording device, or the like in addition to the above structure.

The display orientation of the display panel 2242 is changed as appropriate in accordance with the application mode. Further, the camera lens 2247 is provided on the same surface as the display panel 2242, and thus it can be used as a video phone. The speaker 2243 and the microphone 2244 can be used for videophone calls, recording, and playing sound, etc. as well as voice calls. Moreover, the housings 2240 and 2241 in a state where they are developed as illustrated in FIG. 14D can be slid so that one is lapped over the other; therefore, the size of the portable phone can be reduced, which makes the portable phone suitable for being carried.

The external connection terminal 2248 can be connected to an AC adapter or a variety of cables such as a USB cable, which enables charging of the mobile phone and data communication. Moreover, a larger amount of data can be saved and moved by inserting a recording medium to the external memory slot 2250. Further, in addition to the above functions, an infrared communication function, a television reception function, or the like may be provided.

Figure 14E:
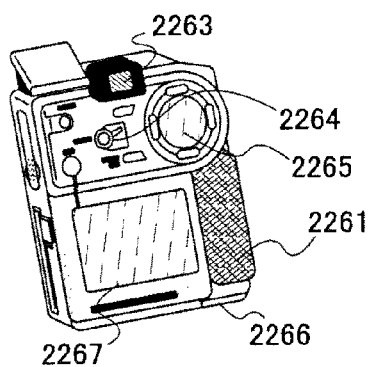

FIG. 14E illustrates a digital camera, which includes a main body 2261, a display portion (A) 2267, an eyepiece 2263, an operation switch 2264, a display portion (B) 2265, a battery 2266, and the like.

Figure 14F:
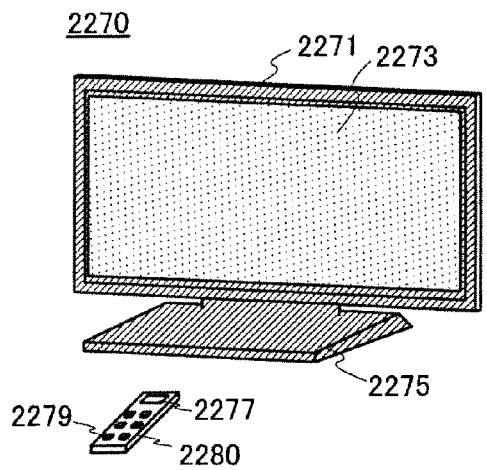

FIG. 14F illustrates a television set 2270, which includes a display portion 2273 incorporated in a housing 2271. The display portion 2273 can display images. Here, the housing 2271 is supported by a stand 2275.

The television set 2270 can be operated by an operation switch of the housing 2271 or a separate remote controller 2280. Channels and volume can be controlled with an operation key 2279 of the remote controller 2280 so that an image displayed on the display portion 2273 can be controlled. Moreover, the remote controller 2280 may have a display portion 2277 in which the information outgoing from the remote controller 2280 is displayed.

Note that the television set 2270 is preferably provided with a receiver, a modem, and the like. A general television broadcast can be received with the receiver. Moreover, when the television set is connected to a communication network with or without wires via the modem, one-way (from a sender to a receiver) or two-way (between a sender and a receiver or between receivers) data communication can be performed.

This application is based on Japanese Patent Application serial no. 2010-006419 filed with Japan Patent Office on Jan. 15, 2010, the entire contents of which are hereby incorporated by reference.

EXPLANATION OF REFERENCE 11 to 18: signal lines, 21 to 28: switches, 31 to 34: wirings, 41 to 48: transistors, 50: substrate, 51: conductive layer, 52: insulating layer, 53: semiconductor layer, 54: conductive layer, 55: conductive layer, 61 to 68: transistors, 70: substrate, 71: insulating layer, 72: semiconductor layer, 73: insulating layer, 74: conductive layer, 75: insulating layer, 76: conductive layer, 77: conductive layer, 101: pixel portion, 102: source signal line driver circuit, 103: gate signal line driver circuit, 104: source signal line, 105: gate signal line, 106A: flexible printed circuit, 106B: flexible printed circuit, 107: pixel, 111: shift register circuit, 112: sampling circuit, 121 to 124: data signal lines, 131 to 139: transistors, 141 to 149: source signal lines, 400: substrate, 402: gate insulating layer, 403: protective insulating layer, 410: transistor, 411: gate electrode layer, 413: channel formation region, 414a: source region, 414b: drain region, 415a: source electrode layer, 415b: drain electrode layer, 416: oxide insulating layer, 430: oxide semiconductor film, 431: oxide semiconductor layer, 2201: main body, 2202: housing, 2203: display portion, 2204: keyboard, 2211: main body, 2212: stylus, 2213: display portion, 2214: operation button, 2215: external interface, 2220: e-book reader, 2221: housing, 2223: housing, 2225: display portion, 2227: display portion, 2231: power button, 2233: operation key, 2235: speaker, 2237: hinge, 2240: housing, 2241: housing, 2242: display panel, 2243: speaker, 2244: microphone, 2245: operation key, 2246: pointing device, 2247: camera lens, 2248: external connection terminal, 2249: solar cell, 2250: external memory slot, 2261: main body, 2263: eyepiece, 2264: operation switch, 2265: display portion (B), 2266: battery, 2267: display portion (A), 2270: television set, 2271: housing, 2273: display portion, 2275: stand, 2277: display portion, 2279: operation key, 2280: remote controller

What is claimed is:

1. A semiconductor device comprising:
   first to n-th transistors (n is a natural number of 2 or more) configured to be turned on in a first period and turned off in a second period;
   (n+1)-th to m-th transistors (m is a natural number of n+2 or more) configured to be turned off in the first period and turned on in the second period;
   first to n-th signal lines; and
   (n+1)-th to m-th signal lines,
   wherein the first to m-th signal lines are parallel,
   wherein a distance between the n-th signal line and the (n+1)-th signal line is longer than a distance between the (n−1)-th signal line and the n-th signal line and is longer than a distance between the (n+1)-th signal line and the (n+2)-th signal line, and
   wherein one of a source terminal and a drain terminal of the n-th transistor is closer to the (n+1)-th transistor than the other of the source terminal and the drain terminal of the n-th transistor.

2. The semiconductor device according to claim 1, wherein a signal is supplied to any one of the first to n-th signal lines and to any one of the (n+1)-th to m-th signal lines through a same wiring.

3. The semiconductor device according to claim 1, wherein m=2n.

4. The semiconductor device according to claim 1, wherein the first to m-th transistors are spaced at regular intervals, and channel length directions of the first to m-th transistors are perpendicular or approximately perpendicular to the first to m-th signal lines,
   wherein one of a source terminal and a drain terminal of the (n+1)-th transistor is closer to the n-th transistor than the other of the source terminal and the drain terminal of the (n+1)-th transistor,
   wherein the other of the source terminal and the drain terminal of the n-th transistor is electrically connected to the n-th signal line, and
   wherein the other of the source terminal and the drain terminal of the (n+1)-th transistor is electrically connected to the (n+1)-th signal line.

5. The semiconductor device according to claim 1, wherein channel formation regions of the first to m-th transistors comprise an oxide semiconductor.

6. The semiconductor device according to claim 1, wherein a shift register circuit which controls switching of the first to m-th transistors is included, and
   wherein the shift register circuit includes a transistor whose channel formation region comprises an oxide semiconductor.

7. The semiconductor device according to claim 1,
wherein an electronic device comprises the semiconductor device.

8. A semiconductor device comprising:
a first set of first to n-th switches (n is a natural number of 2 or more) configured to be turned on in a first period and turned off in a second period and a third period;
a second set of (n+1)-th to 2n-th switches configured to be turned on in the second period and turned off in the first period and the third period;
a third set of (2n+1)-th to 3n-th switches configured to be turned on in the third period and turned off in the first period and the second period;
a fourth set of first to n-th signal lines;
a fifth set of (n+1)-th to 2n-th signal lines; and
a sixth set of (2n+1)-th to 3n-th signal lines,
wherein a signal is supplied to any one of the first to n-th signal lines, to any one of the (n+1)-th to 2n-th signal lines, and to any one of the (2n+1)-th to 3n-th signal lines through a same wiring,
wherein the first to 3n-th signal lines are parallel,
wherein a distance between the n-th signal line and the (n+1)-th signal line is longer than a distance between the (n−1)-th signal line and the n-th signal line and is longer than a distance between the (n+1)-th signal line and the (n+2)-th signal line, and
wherein a distance between the 2n-th signal line and the (2n+1)-th signal line is longer than a distance between the (2n−1)-th signal line and the 2n-th signal line and is longer than a distance between the (2n+1)-th signal line and the (2n+2)-th signal line.

9. The semiconductor device according to claim 8,
wherein the first to 3n-th switches are first to 3n-th transistors.

10. The semiconductor device according to claim 9,
wherein the first to 3n-th transistors are spaced at regular intervals, and channel length directions of the first to 3n-th transistors are perpendicular or approximately perpendicular to the first to 3n-th signal lines,
wherein one of a source terminal and a drain terminal of the n-th transistor is closer to the (n+1)-th transistor than the other of the source terminal and the drain terminal of the n-th transistor,
wherein one of a source terminal and a drain terminal of the (n+1)-th transistor is closer to the n-th transistor than the other of the source terminal and the drain terminal of the (n+1)-th transistor,
wherein the other of the source terminal and the drain terminal of the n-th transistor is electrically connected to the n-th signal line, and
wherein the other of the source terminal and the drain terminal of the (n+1)-th transistor is electrically connected to the (n+1)-th signal line.

11. The semiconductor device according to claim 10,
wherein one of a source terminal and a drain terminal of the 2n-th transistor is closer to the (2n+1)-th transistor than the other of the source terminal and the drain terminal of the 2n-th transistor,
wherein one of a source terminal and a drain terminal of the (2n+1)-th transistor is closer to the 2n-th transistor than the other of the source terminal and the drain terminal of the (2n+1)-th transistor,
wherein the other of the source terminal and the drain terminal of the 2n-th transistor is electrically connected to the 2n-th signal line, and
wherein the other of the source terminal and the drain terminal of the (2n+1)-th transistor is electrically connected to the (2n+1)-th signal line.

12. The semiconductor device according to claim 9,
wherein channel formation regions of the first to m-th transistors comprise an oxide semiconductor.

13. The semiconductor device according to claim 9,
wherein a shift register circuit which controls switching of the first to 3n-th transistors is included, and
wherein the shift register circuit includes a transistor whose channel formation region comprises an oxide semiconductor.

14. The semiconductor device according to claim 8,
wherein an electronic device comprises the semiconductor device.

* * * * *